(12) United States Patent
Kuramoto et al.

(10) Patent No.: US 9,502,624 B2
(45) Date of Patent: Nov. 22, 2016

(54) RESIN MOLDING, SURFACE MOUNTED LIGHT EMITTING APPARATUS AND METHODS FOR MANUFACTURING THE SAME

(75) Inventors: Masafumi Kuramoto, Anan (JP); Tomohisa Kishimoto, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/162,974

(22) PCT Filed: May 18, 2006

(86) PCT No.: PCT/JP2006/309927
§ 371 (c)(1),
(2), (4) Date: Sep. 23, 2008

(87) PCT Pub. No.: WO2007/135707
PCT Pub. Date: Nov. 29, 2007

(65) Prior Publication Data
US 2009/0050925 A1  Feb. 26, 2009

(51) Int. Cl.
*H01L 33/52* (2010.01)
*H01L 33/56* (2010.01)
(Continued)

(52) U.S. Cl.
CPC ............... *H01L 33/56* (2013.01); *H01L 33/26* (2013.01); *H01L 33/32* (2013.01); *H01L 33/34* (2013.01); *H01L 33/44* (2013.01); *H01L 33/486* (2013.01);
(Continued)

(58) Field of Classification Search
USPC .................................................. 257/99, 100
See application file for complete search history.

(56) References Cited

U.S. PATENT DOCUMENTS 5,450,105 A   9/1995  Dangelo
5,883,424 A   3/1999  Tanaka
(Continued)

FOREIGN PATENT DOCUMENTS

EP   1 369 458 B1   12/2003
EP   1 914 811 A1   4/2008
(Continued)

OTHER PUBLICATIONS

Information Statement submitted to JPO for JP 2008-182468, dated Jun. 27, 2011.
(Continued)

*Primary Examiner* — Benjamin Sandvik
(74) *Attorney, Agent, or Firm* — Birch, Stewart, Kolasch & Birch, LLP

(57) ABSTRACT

The present invention provides a surface mounted light emitting apparatus which has long service life and favorable property for mass production, and a molding used in the surface mounted light emitting apparatus.
The surface mounted light emitting apparatus comprises the light emitting device 10 based on GaN which emits blue light, the first resin molding 40 which integrally molds the first lead 20 whereon the light emitting device 10 is mounted and the second lead 30 which is electrically connected to the light emitting device 10, and the second resin molding 50 which contains YAG fluorescent material and covers the light emitting device 10. The first resin molding 40 has the recess 40c comprising the bottom surface 40a and the side surface 40b formed therein, and the second resin molding 50 is placed in the recess 40c. The first resin molding 40 is formed from a thermosetting resin such as epoxy resin by the transfer molding process, and the second resin molding 50 is formed from a thermosetting resin such as silicone resin.

54 Claims, 8 Drawing Sheets

(51) Int. Cl.
*H01L 33/48* (2010.01)
*H01L 33/62* (2010.01)
*H01L 33/26* (2010.01)
*H01L 33/32* (2010.01)
*H01L 33/34* (2010.01)
*H01L 33/44* (2010.01)
*H01L 33/64* (2010.01)
*H01L 23/00* (2006.01)

(52) U.S. Cl.
CPC .............. *H01L 33/62* (2013.01); *H01L 24/45* (2013.01); *H01L 24/48* (2013.01); *H01L 24/73* (2013.01); *H01L 33/64* (2013.01); *H01L 33/647* (2013.01); *H01L 2224/32245* (2013.01); *H01L 2224/45144* (2013.01); *H01L 2224/48091* (2013.01); *H01L 2224/48247* (2013.01); *H01L 2224/73265* (2013.01); *H01L 2924/0102* (2013.01); *H01L 2924/01004* (2013.01); *H01L 2924/01012* (2013.01); *H01L 2924/01025* (2013.01); *H01L 2924/01057* (2013.01); *H01L 2924/01063* (2013.01); *H01L 2924/01066* (2013.01); *H01L 2924/01067* (2013.01); *H01L 2924/01078* (2013.01); *H01L 2924/01079* (2013.01); *H01L 2924/01322* (2013.01); *H01L 2924/12035* (2013.01); *H01L 2924/12036* (2013.01); *H01L 2924/12041* (2013.01); *H01L 2924/12042* (2013.01); *H01L 2924/3025* (2013.01)

(56) References Cited

U.S. PATENT DOCUMENTS

| | | | |
|---|---|---|---|
| 5,998,925 A | 12/1999 | Shimizu et al. | |
| 6,091,139 A | 7/2000 | Adachi et al. | |
| 6,097,101 A | 8/2000 | Sato et al. | |
| 6,142,677 A | 11/2000 | Sato et al. | |
| 6,208,017 B1 | 3/2001 | Kurihara | |
| 6,274,890 B1 | 8/2001 | Oshio et al. | |
| 6,638,780 B2 | 10/2003 | Fukasawa et al. | |
| 6,712,529 B2 | 3/2004 | Horio | |
| 6,770,498 B2 | 8/2004 | Hsu | |
| 6,803,606 B2 | 10/2004 | Takenaka | |
| 6,809,162 B2 | 10/2004 | Rubinsztajn | |
| 6,809,261 B1 | 10/2004 | Ng et al. | |
| 6,924,514 B2 | 8/2005 | Suenaga | |
| 6,924,596 B2 | 8/2005 | Sato et al. | |
| 6,960,878 B2 | 11/2005 | Sakano et al. | |
| 6,995,510 B2 | 2/2006 | Murakami et al. | |
| 7,012,277 B2 | 3/2006 | Takenaka | |
| 7,102,213 B2 | 9/2006 | Sorg | |
| 7,187,009 B2 | 3/2007 | Fukasawa et al. | |
| 7,268,479 B2 | 9/2007 | Aisenbrey | |
| 7,279,719 B2 | 10/2007 | Suehiro et al. | |
| 7,317,181 B2 | 1/2008 | Murakami et al. | |
| 7,342,357 B2 | 3/2008 | Sakano et al. | |
| 7,347,603 B2 | 3/2008 | Ikeda et al. | |
| 7,371,462 B2 | 5/2008 | Tsumura et al. | |
| 7,507,682 B2 | 3/2009 | Takase et al. | |
| 7,560,145 B2 | 7/2009 | Ouchi et al. | |
| 7,838,357 B2 | 11/2010 | Bogner et al. | |
| 2001/0042865 A1 | 11/2001 | Oshio et al. | |
| 2002/0187570 A1 | 12/2002 | Fukasawa et al. | |
| 2002/0190262 A1 | 12/2002 | Nitta et al. | |
| 2003/0071368 A1 | 4/2003 | Rubinsztajn | |
| 2003/0080341 A1* | 5/2003 | Sakano et al. | 257/79 |
| 2003/0107316 A1 | 6/2003 | Murakami et al. | |
| 2003/0132701 A1 | 7/2003 | Sato et al. | |
| 2003/0144420 A1 | 7/2003 | Tsumura et al. | |
| 2004/0041165 A1 | 3/2004 | Fukasawa et al. | |
| 2004/0075100 A1* | 4/2004 | Bogner et al. | 257/99 |
| 2004/0126504 A1 | 7/2004 | Ouchi et al. | |
| 2004/0159850 A1 | 8/2004 | Takenaka | |
| 2004/0178509 A1* | 9/2004 | Yoshino et al. | 257/780 |
| 2004/0189170 A1 | 9/2004 | Aisenbrey | |
| 2004/0256706 A1* | 12/2004 | Nakashima | 257/678 |
| 2005/0072981 A1 | 4/2005 | Suenaga | |
| 2005/0139851 A1* | 6/2005 | Sato | 257/99 |
| 2005/0211991 A1 | 9/2005 | Mori et al. | |
| 2005/0245018 A1 | 11/2005 | Bogner et al. | |
| 2005/0269587 A1* | 12/2005 | Loh et al. | 257/99 |
| 2005/0280017 A1* | 12/2005 | Oshio et al. | 257/99 |
| 2006/0027903 A1 | 2/2006 | Inao et al. | |
| 2006/0029811 A1* | 2/2006 | Sugioka et al. | 428/413 |
| 2006/0043401 A1* | 3/2006 | Lee et al. | 257/99 |
| 2006/0054912 A1 | 3/2006 | Murakami et al. | |
| 2006/0058473 A1 | 3/2006 | Kawada et al. | |
| 2006/0097366 A1* | 5/2006 | Sirinorakul et al. | 257/666 |
| 2006/0157828 A1 | 7/2006 | Sorg | |
| 2008/0099727 A1 | 5/2008 | Sakano et al. | |

FOREIGN PATENT DOCUMENTS

| | | |
|---|---|---|
| JP | 58-24453 Y2 | 5/1983 |
| JP | 60-170982 | 9/1985 |
| JP | 2-268471 A | 11/1990 |
| JP | 02-288274 | 11/1990 |
| JP | 5-291629 A | 11/1993 |
| JP | 07-106638 | 4/1995 |
| JP | 7-47682 B2 | 5/1995 |
| JP | 7-176793 A | 7/1995 |
| JP | 08111493 A | 4/1996 |
| JP | 2656336 B2 | 5/1997 |
| JP | 9-213855 A | 8/1997 |
| JP | 9-318842 A | 12/1997 |
| JP | 10-144965 A | 5/1998 |
| JP | 10163519 A | 6/1998 |
| JP | 10242513 A | 9/1998 |
| JP | 10261821 A | 9/1998 |
| JP | 10-284759 | 10/1998 |
| JP | 11-087780 A | 3/1999 |
| JP | 11-177136 A | 7/1999 |
| JP | 11-191562 | 7/1999 |
| JP | 11-284101 A | 10/1999 |
| JP | 11-307820 A | 11/1999 |
| JP | 11-340378 | 12/1999 |
| JP | 11-340517 | 12/1999 |
| JP | 2000-196151 | 7/2000 |
| JP | 2001-015668 | 1/2001 |
| JP | 2001-024228 A | 1/2001 |
| JP | 2001-59920 A | 3/2001 |
| JP | 2001-168398 A | 6/2001 |
| JP | 2001-234032 A | 8/2001 |
| JP | 2002-016293 | 1/2002 |
| JP | 2002-080733 | 3/2002 |
| JP | 2002-088244 | 3/2002 |
| JP | 2002-097252 | 4/2002 |
| JP | 2002-118294 | 4/2002 |
| JP | 2002-176184 A | 6/2002 |
| JP | 2002-223005 A | 8/2002 |
| JP | 2002-252373 A | 9/2002 |
| JP | 2002-302533 A | 10/2002 |
| JP | 2002-314100 A | 10/2002 |
| JP | 2002-324920 A | 11/2002 |
| JP | 2002-327114 | 11/2002 |
| JP | 2002-344030 A | 11/2002 |
| JP | 2002-368281 A | 12/2002 |
| JP | 2003-073452 A | 3/2003 |
| JP | 2003-073552 | 3/2003 |
| JP | 2003-110145 | 4/2003 |
| JP | 2003-124529 A | 4/2003 |
| JP | 2003-133656 A | 5/2003 |
| JP | 2003-174200 A | 6/2003 |
| JP | 2003-176333 | 6/2003 |
| JP | 2003-179269 A | 6/2003 |
| JP | 2043-163380 A | 6/2003 |
| JP | 2003-188420 | 7/2003 |
| JP | 2003-188421 A | 7/2003 |
| JP | 2003-209293 | 7/2003 |
| JP | 2003-218399 | 7/2003 |
| JP | 2003-224305 A | 8/2003 |
| JP | 2003-227969 A | 8/2003 |

(56) References Cited

FOREIGN PATENT DOCUMENTS

| | | |
|---|---|---|
| JP | 2003-234425 | 8/2003 |
| JP | 2003-234511 A | 8/2003 |
| JP | 2003-268070 A | 9/2003 |
| JP | 2003-277479 | 10/2003 |
| JP | 2003-282948 A | 10/2003 |
| JP | 2003-298117 A | 10/2003 |
| JP | 2003-303936 | 10/2003 |
| JP | 2003-318448 A | 11/2003 |
| JP | 2004-002783 | 1/2004 |
| JP | 2004-002810 | 1/2004 |
| JP | 2004-002823 | 1/2004 |
| JP | 3512732 B2 | 1/2004 |
| JP | 2004-039691 A | 2/2004 |
| JP | 2004-53494 A | 2/2004 |
| JP | 2004-071675 | 3/2004 |
| JP | 2004-088013 | 3/2004 |
| JP | 2004-111937 A | 4/2004 |
| JP | 2004-134699 | 4/2004 |
| JP | 2004-146411 A | 5/2004 |
| JP | 2004-172579 A | 6/2004 |
| JP | 2004-172636 A | 6/2004 |
| JP | 2004-186488 A | 7/2004 |
| JP | 2004-207621 A | 7/2004 |
| JP | 2004-207688 A | 7/2004 |
| JP | 2004-214436 A | 7/2004 |
| JP | 2004-228239 A | 8/2004 |
| JP | 2004-228387 | 8/2004 |
| JP | 2004-228400 A | 8/2004 |
| JP | 2004-274027 A | 9/2004 |
| JP | 2004-292706 A | 10/2004 |
| JP | 2004-292779 | 10/2004 |
| JP | 2004-307846 | 11/2004 |
| JP | 2004-320032 A | 11/2004 |
| JP | 2004-335740 | 11/2004 |
| JP | 2004-342781 A | 12/2004 |
| JP | 2005-019985 A | 1/2005 |
| JP | 2005-039100 A | 2/2005 |
| JP | 2005-507178 A | 3/2005 |
| JP | 2005-136379 A | 5/2005 |
| JP | 2005-146191 A | 6/2005 |
| JP | 2005-243795 | 9/2005 |
| JP | 2005-259972 A | 9/2005 |
| JP | 2005-277331-AA | 10/2005 |
| JP | 2005-285899 A | 10/2005 |
| JP | 2005-306952 A | 11/2005 |
| JP | 2005-317951 A | 11/2005 |
| JP | 2005-353914 A | 12/2005 |
| JP | 2005-539386 A | 12/2005 |
| JP | 2006-049442 A | 2/2006 |
| JP | 2006-49624 A | 2/2006 |
| JP | 2006-093486 A | 4/2006 |
| JP | 2006-093697 A | 4/2006 |
| JP | 2006-140207 A | 6/2006 |
| JP | 2006-156704 A | 6/2006 |
| JP | 2007-329219 | 12/2007 |
| WO | WO 03/038912 A2 | 5/2003 |
| WO | WO 2004-027882 A2 | 4/2004 |
| WO | WO-2007/015426 A1 | 2/2007 |

OTHER PUBLICATIONS

Information Statement submitted to JPO for JP 2008-182469, dated Jun. 27, 2011.
Carfagna et al., The Effect of Prepolymer Composition of Amino-Hardened Liquid Crystaline Epoxy Resins on Physical Properties of Cured Thermoset, "Macromolecular Symposia", vol. 148, Issue 1, Dec. 1999, pp. 197-209.
EPON Resin 825, "Technical Data Sheet" [online], republished Sep. 2005, Internet <URL:http://www2.momentive.com/Products/TechnicalDataSHeet.aspx>.
JP Office Action issued Apr. 5, 2011 in Japanese Application No. 2008-182468.
JP Office Action issued Apr. 5, 2011, in Japanese Application No. 2008-182469.
K. Sato, Learning Facilitation Effects of Videotaped Teaching-Materials in High School Technology Education-Cutting Mechanism-(1) Teaching Material Development, "Journal of Educational Technology of Educational Technology Center affiliated with the Faculty of Education, Iwate University", No. 2, 1980, pp. 7-10.
K. Tanaka, Meso-Mechanical Research of Mixed Mode Fatigue Crack Development for High-Strength CFRP, "Working Papers for 1995 and 1996 Grants-in-Aid for Scientific Research (Basic Research (B))", Mar. 1997, pp. 1-65.
M. Akatsuka et al., Development of Epoxy Resins with Controlled High Order Structures Having Excellent Heat Release Properties, "IEEJ Transactions on Fundamentals and Materials", vol. 123, No. 7, 2003, pp. 687-692.
Third Party submission information Statement of Japanese patent Application No. 2008-182468 submitted to the Japanese Patent Office on Apr. 28, 2011.
Information Statement of Japanese patent application No. 2008-182468 submitted to the Japanese Patent Office on Jul. 26, 2011.
Office Action issued Aug. 13, 2008 in Japanese Application No. 2006-158084.
Office Action issued Aug. 19, 2008 in Japanese Application No. 2006-158493.
Office Action issued Feb. 2, 2010 in Japanese Application No. 2006-158084.
Office Action issued Feb. 3, 2009 in Japanese Application No. 2006-158084.
Office Action issued Jan. 20, 2009 in Japanese Application No. 2004-345195.
Office Action issued Jan. 20, 2009 in Japanese Application No. 2006-158493.
Office Action issued Jun. 15, 2010 in Japanese Application No. 2004-345195.
Office Action issued Jun. 22, 2010 in Japanese Application No. 2006-158493.
Office Action issued Jun. 8, 2010 in Japanese Application No. 2006-158084.
Office Action issued May 20, 2008 in Japanese Application No. 2006-158493.
Office Action issued May 25, 2010 in Japanese Application No. 2006-158084.
Office Action issued Sep. 9, 2008 in Japanese Application No. 2004-345195.
Information Statement of Japanese patent application No. 2008-182468 submitted to the Japanese Patent Office on Aug. 30, 2011.
Information Statement of Japanese patent application No. 2008-182469 submitted to the Japanese Patent Office on Aug. 30, 2011.
Information Statement of Japanese patent application No. 2008-182469 submitted to the Japanese Patent Office on Jan. 24, 2012.
Official action of the corresponding Japanese patent application No. 2008-182468 issued on Oct. 11, 2011.
Official action of the corresponding Japanese patent application No. 2008-182469 issued on Oct. 11, 2011.
JP Office Action issued on May 13, 2008 in JP Patent Application No. 2004-345195.
JP Office Action issued on May 13, 2008 in JP Patent Application No. 2006-158084.
U.S. Office Action issued in U.S. Appl. No. 13/828,118, filed Jun. 20, 2014.
U.S. Office Action issued in U.S. Appl. No. 13/828,118, filed Oct. 10, 2014.
U.S. Office Action dated Dec. 11, 2015, for U.S. Appl. No. 13/828,118.
U.S. Office Action dated Jul. 15, 2015, for U.S. Appl. No. 13/828,118.

* cited by examiner

RESIN MOLDING, SURFACE MOUNTED LIGHT EMITTING APPARATUS AND METHODS FOR MANUFACTURING THE SAME

BACKGROUND OF THE INVENTION

Field of the Invention

The present invention relates to a surface mounted light emitting apparatus used in illumination apparatus, display, backlight for mobile phone, auxiliary light source for illumination or other light source for consumer electric apparatus, a resin molding suitable for the surface mounted light emitting apparatus and methods for manufacturing both.

Description of the Related Art

A surface mounted light emitting apparatus which employs a light emitting device is compact, has high power efficiency and emits light of clear color. The light emitting device is also free from burnout, because it is a semiconductor device. It also has an excellent initial drive characteristic, and high durability against vibration and repetitive cycles of turning on and off. Because of such excellent characteristics, light emitting apparatuses which use light emitting devices such as light emitting diode (LED) or laser diode (LD) are used as various light sources.

FIG. 11 shows a surface mounted light emitting apparatus of the prior art. The surface mounted light emitting apparatus of the prior art comprises a light emitting device 210, a lead frame for mounting 220 for mounting the former thereon, a lead frame for connection 230 which is connected to the light emitting device 210 via leads, and a molding 240 which covers most of the lead frames (refer to, for example, Japanese Unexamined Patent Publication (Kokai) No. 11-087780 (claims, paragraph [0020])). In the surface mounted light emitting apparatus, the molding 240 is often formed from a light blocking resin such as liquid crystal polymer, PPS (polyphenyl sulfide) or nylon which is a thermoplastic resin for the reason of convenience in mass production. Also because the thermoplastic resin used in the molding 240 is required to have enough heat resistance to endure the heat of reflow soldering, engineering polymers such as polyphthalamide, liquid crystal polymer and PPS are used. The thermoplastic resin is formed by injection molding process. The injection molding process is employed in preference for the reason of high productivity thereof, in the manufacture of the surface mounted light emitting apparatus which has high output power at a low cost.

The thermoplastic engineering plastics as mentioned above used in forming the molding 240 for the surface mounted light emitting apparatus of the prior art have high heat resistance, although contains an aromatic component in the molecule and therefore have low resistance to light. Also because these materials do not have hydroxide group which improves adhesive property at the end of the molecule, sufficient bonding cannot be achieved between the lead frames 220, 230 and the translucent encapsulant resin 250. Moreover, as the light emitting devices are produced with rapidly increasing output power in recent years, the problem of light degradation of the molding 240 is becoming more conspicuous. Bonding between the translucent encapsulant resin 250 and the thermoplastic engineering polymer 240, in particular, can be easily destroyed due in part to the weak bonding strength, thus resulting in delamination. Even when the delamination does not result, discoloration caused by light degradation proceeds and results in drastically short life of the light emitting device.

There is a technology proposed to solve these problems which forms the molding from an inorganic material that is free from light degradation, such as ceramics. However, the molding formed from ceramics makes it difficult to insert the lead frame which has high thermal conductivity, and therefore resistance to heat transfer cannot be decreased. Also because the thermal expansion coefficient is different from that of the translucent encapsulant resin by a factor of 10 or more, sufficient level of reliability has not been achieved.

SUMMARY OF THE INVENTION

With the background described above, an object of the present invention is to provide a surface mounted light emitting apparatus which has long service life and is suitable for mass production, and a molding used to make the surface mounted light emitting apparatus. Another object is to provide a method for easily manufacturing the surface mounted light emitting apparatus and the molding.

Through research for solving the problems described above, the inventor of the present application completed the invention.

The present invention is a surface mounted light emitting apparatus comprising a light emitting device, a first resin molding which integrally molds a first lead whereon the light emitting device is placed and a second lead electrically connected to the light emitting device, and a second resin molding which covers the light emitting device, wherein the first resin molding has a recess comprising a bottom surface and a side surface, the first lead is exposed on the bottom surface of the recess of the first resin molding, the light emitting device is mounted on the exposed portion, and the first resin molding and the second resin molding are formed from thermosetting resins. The thermosetting resins are preferably such that do not have aromatic component in the molecule, if possible.

The present invention is a surface mounted light emitting apparatus comprising a light emitting device, a first resin molding which integrally molds a first lead whereon the light emitting device is mounted and a second lead electrically connected to the light emitting device, and a second resin molding which covers the light emitting device, wherein the first lead has a first inner lead and a first outer lead with the first inner lead having the light emitting device mounted thereon and electrically connected to a first electrode of the light emitting device and the first outer lead is exposed from the first resin molding, while the second lead has a second inner lead and a second outer lead with the second inner lead being electrically connected to a second electrode of the light emitting device, the second outer lead is exposed from the first resin molding, the first resin molding has a recess comprising a bottom surface and a side surface, the first inner lead is exposed from the bottom surface of the recess of the first resin molding, the light emitting device is mounted on the exposed portion, and the first resin molding and the second resin molding are formed from thermosetting resin. The thermosetting resin is preferably such that does not have aromatic component in the molecule, if possible.

The back side of the first lead, opposite to the principal surface where the light emitting device is placed, is preferably exposed from the first resin molding.

The back sides of the first lead and the second lead, opposite to the principal surface where the light emitting device is placed, may be exposed from the first resin molding.

The exposed portion of the back side of the first lead and the exposed portion of the back side of the second lead preferably lie on substantially the same plane.

The exposed portion of the back side of the first inner lead may be placed in such a manner as a heat sink makes contact therewith.

The first resin molding is formed by transfer molding process.

The first resin molding is preferably formed from at least one kind selected from among the group consisting of epoxy resin, modified epoxy resin, silicone resin, modified silicone resin, acrylate resin and urethane resin.

The first resin molding may contain at least one kind selected from among the group consisting of filler, diffusing agent, pigment, fluorescent material, reflective material and light blocking material.

The second resin molding may contain at least one kind selected from among the group consisting of filler, diffusing agent, pigment, fluorescent material and reflective material.

The present invention is a resin molding which integrally molds a first lead a second lead, wherein the first lead has a first inner lead and a first outer lead with the first inner lead placed in the resin molding and the first outer lead being exposed from the resin molding, the second lead has a second inner lead and a second outer lead with the second inner lead being placed in the resin molding and the second outer lead being exposed from the resin molding, while the resin molding has a recess comprising a bottom surface and a side surface, the first inner lead and the second inner lead are exposed from the bottom surface of the recess of the resin molding, and the resin molding is formed from a thermosetting resin.

The present invention is a resin molding which integrally molds a first lead a second lead, wherein the first lead has a first inner lead and a first outer lead with the first inner lead being placed in the resin molding and the first outer lead being exposed from the resin molding, the second lead has a second inner lead and a second outer lead with the second inner lead being placed in the resin molding and the second outer lead being exposed from the resin molding, while the resin molding has a recess comprising a bottom surface and a side surface, the first inner lead and the second inner lead are exposed from the bottom surface of the recess of the resin molding, the back side of the first inner lead which is opposite to the principal surface where the recess is formed is exposed from the resin molding, and the resin molding is formed from a thermosetting resin.

The exposed portion of the back side of the first lead and the exposed portion of the back side of the second lead preferably lie on substantially the same plane.

The thermosetting resin is preferably at least one kind selected from among the group consisting of epoxy resin, modified epoxy resin, silicone resin, modified silicone resin, acrylate resin and urethane resin.

The resin molding is formed by the transfer molding process.

The resin molding may contain at least one kind selected from among the group consisting of filler, diffusing agent, pigment, fluorescent material, reflective material and light blocking material mixed therein.

The present invention is a method of manufacturing the resin molding which integrally molds the first lead the second lead and has the recess comprising the bottom surface and the side surface, wherein an upper die has a recess corresponding to the recess of the resin molding, the first lead has the first inner lead and the first outer lead, the second lead has the second inner lead and the second outer lead, the method comprising a first process where the first inner lead and the second inner lead corresponding to the bottom of the recess of the resin molding and the first outer lead and the second outer lead are interposed between the upper die and a lower die, a second process where the thermosetting resin is poured into the cavity formed between the upper die and the lower die by the transfer molding process, and a third process where the thermosetting resin poured into the cavity is heated so as to be cured and form the resin molding.

The present invention is a method of manufacturing the surface mounted light emitting apparatus which comprises the resin molding that molds integrally the first lead the second lead and has the recess comprising the bottom surface and the side face, the light emitting device placed on the first lead and the second resin molding which covers the light emitting device, wherein the upper die has a recess corresponding to the recess of the resin molding, the first lead has the first inner lead and the first outer lead, the second lead has the second inner lead and the second outer lead, the method comprising a first process where the first inner lead and the second inner lead corresponding to the bottom surface of the recess of the first resin molding and the first outer lead and the second outer lead are interposed between the upper die and the lower die, a second process where the first thermosetting resin is poured into the cavity formed between the upper die and the lower die by the transfer molding process, a third process where the first thermosetting resin that is poured into the cavity is heated so as to be cured, a fourth process where the upper die is removed, a fifth process where the light emitting device is mounted on the first inner lead with the first electrode of the light emitting device and the first inner lead being electrically connected with each other and the second electrode of the light emitting device and the second inner lead being electrically connected with each other, a sixth process where a second thermosetting resin is placed in the recess where the light emitting device is mounted, and a seventh process where the second thermosetting resin is heated so as to be cured and form the second resin molding.

The present invention, constituted as described above, has the effects described below.

The present invention is a surface mounted light emitting apparatus comprising the light emitting device, the first resin molding which integrally molds the first lead whereon the light emitting device is mounted and the second lead which is electrically connected to the light emitting device and the second resin molding which covers the light emitting device, wherein the first resin molding has a recess comprising a bottom surface and a side surface, the first lead is exposed from the bottom surface of the recess of the first resin molding, the light emitting device is mounted on the exposed portion, and the first resin molding and the second resin molding are formed from thermosetting resins.

This constitution makes it possible to provide the surface mounted light emitting apparatus which has heat resistance and high resistance to light.

By forming the first resin molding from the thermosetting resin, it is made possible to prevent delamination from occurring in the interface with the second resin molding. This is because the thermosetting resin has a number of reactive functional groups on the surface thereof and is therefore capable of forming an interface for firm bonding with the second resin molding, unlike a thermoplastic resin. Also by forming the second resin molding from a thermosetting resin, it is made possible to achieve isotropic thermal expansion and shrinkage behavior similar to that of the first resin molding, and therefore thermal stress in the interface of bonding due to temperature change can be decreased further. In addition, by forming the second resin molding from the thermosetting resin similar to that of the first resin molding, it is made possible not only to achieve the improvement of the bonding strength through reduction of the surface tension, but also to achieve very strong bonding due to the progress of curing reaction in the interface. As for the light resistance, the aromatic component which has low light resistance can be easily removed because the composition of the thermosetting resin which has 3-dimensional cross linkage structure can be easily changed without compromising the heat resistance. In the case of a thermoplastic resin, heat resistance and an aromatic component are virtually synonym, and a molding which can endure the heat of reflow soldering cannot be obtained without containing an aromatic component. Therefore, by forming the first resin molding and the second resin molding from the thermosetting resin, it is made possible to make the surface mounted light emitting apparatus which has inherently strong interface of bonding, high resistance to delamination and undergoing less light degradation with less aging effect.

The second resin molding is placed in the recess where the light emitting device is mounted. This constitution enables it to easily cover the light emitting device. Also because the light emitting device has a refraction index significantly different from that of air, light emitted by the light emitting device does not emerge efficiently to the outside, while covering the light emitting device with the second resin molding allows the light emitted by the light emitting device to emerge efficiently to the outside. Also light emitted by the light emitting device is reflected on the bottom surface and the side surface of the recess, and emerges from the principal surface side where the light emitting device is mounted. Thus the optical output from the principal surface can be improved. As a result, light emitted by the light emitting device can be reflected with higher efficiency since the first lead is made of a metal, than in the case where the bottom surface of the recess is covered by the first resin molding.

For example, epoxy resin may be used for the first resin molding and hard silicone resin may be used for the second resin molding.

The present invention is the surface mounted light emitting apparatus comprising the light emitting device, the first resin molding which integrally molds the first lead whereon the light emitting device is placed and the second lead which is electrically connected to the light emitting device, and the second resin molding which covers the light emitting device, wherein the first lead has the first inner lead and the first outer lead with the first inner lead having the light emitting device placed thereon and is electrically connected to the first electrode of the light emitting device and the first outer lead is exposed from the first resin molding, the second lead has the second inner lead and the second outer lead with the second inner lead being electrically connected to the second electrode of the light emitting device and exposed from the first resin molding, the first resin molding has the recess comprising the bottom surface and the side face, the first inner lead is exposed on the bottom surface of the recess of the first resin molding, the light emitting device is placed on the exposed portion, and the first resin molding and the second resin molding are formed from thermosetting resin. With this constitution, the surface mounted light emitting apparatus which is excellent in heat resistance, light resistance and in bonding strength can be made. Also because the first resin molding and the second resin molding are formed from the thermosetting resin, the first resin molding and the second resin molding can be prevented from peeling off each other. Moreover, since the first lead and the second lead of predetermined lengths are used by bending or otherwise processing, electrical connection with the external electrode can be easily established and the device can be used simply by mounting on an existing illuminating apparatus.

The back side of the first lead, opposite to the principal surface where the light emitting device is mounted, is preferably exposed from the first resin molding. When electric power is supplied to the surface mounted light emitting apparatus, the light emitting device emits light and, at the same time, generates heat. The constitution described above enables it to efficiently dissipate the heat to the outside. Especially because the heat generated by the light emitting device can be transferred to the outside in the shortest path possible, very efficient heat dissipation is achieved.

The back sides of the first lead and of the second lead, opposite to the principal surface where the light emitting device is mounted, may be exposed from the first resin molding. This constitution enables it to efficiently dissipate the heat generated by the light emitting device to the outside. The first lead and the second lead function as electrodes, and therefore can be very easily connected to external terminals. Especially when the first lead and the second lead having large thickness are used, this constitution makes mounting easier even when these leads are difficult to bend. Also because the first lead and the second lead are held between predetermined dies in the manufacturing process, occurrence of burrs can be reduced and mass productivity can be improved. However, whole surface of the back sides of the first lead and of the second lead may not be exposed, and only the portion where it is desired to suppress the occurrence of burrs may be exposed.

The exposed portion of the back side of the first lead and the exposed portion of the back side of the second lead preferably lie substantially in the same plane. This enables it to improve the stability during mounting of the surface mounted light emitting apparatus. Also because the exposed portions lie in the same plane, the surface mounted light emitting apparatus may be mounted on an external electrode of flat plate shape by means of a solder, which enables it to improve the ease of mounting the surface mounted light emitting apparatus. In addition, it makes it very easy to mold by means of dies.

The exposed portion of the back side of the first inner lead may be disposed so as to make contact with the heat sink. In addition to the arrangement of the heat sink as an external member separately from the surface mounted light emitting apparatus, the heat sink may also be disposed integrally with the surface mounted light emitting apparatus. With this configuration, since heat generated by the light emitting device is dissipated through the heat sink to the outside, the heat dissipation performance can be improved further. Also in case the heat sink is disposed as an external member, the position where the surface mounted light emitting apparatus is mounted can be easily determined.

The first resin molding is formed by the transfer molding process. While complex shapes cannot be formed by the injection molding process, the transfer molding process is capable of forming complex shapes. The first resin molding which has the recess, in particular, can be formed easily.

The first resin molding is preferably formed from at least one kind selected from among the group consisting of epoxy resin, modified epoxy resin, silicone resin, modified silicone resin, acrylate resin and urethane resin. Among these, epoxy resin, modified epoxy resin, silicone resin and modified silicone resin are preferably used and epoxy resin is particularly preferable. Use of such a material makes it possible to provide the surface mounted light emitting apparatus having high heat resistance, high light resistance, high bonding strength and ease of manufacturing in mass production. The first resin molding can be suppressed from degrading by using a thermosetting resin in forming the first resin molding than using a thermoplastic resin, thus elongating the service life of the surface mounted light emitting apparatus.

The first resin molding may contain at least one kind selected from among the group consisting of filler, diffusing agent, pigment, fluorescent material, reflective material and light blocking material mixed therein. Various materials are added in accordance to the requirement of the first resin molding. For example, a resin having high translucency may be used in the first resin molding and a fluorescent material may be mixed in the first resin molding. With this constitution, light emerging through the side face or the bottom surface of the light emitting device is absorbed by the fluorescent material and is emitted after being subjected to wavelength conversion, so that light of the desired color can be obtained from the surface mounted light emitting apparatus as a whole. For example, in order to diffuse the emitted light uniformly, filler, diffusing agent, reflective material or the like may be added to the side face or the bottom of the light emitting device. For example, in order to reduce the light emerging from the back surface of the surface mounted light emitting apparatus, a translucent resin may be mixed. Particularly, it is preferable that the first resin molding is formed from epoxy resin which contains titanium oxide and silica or alumina mixed therein, which enables it to provide the surface mounted light emitting apparatus having high heat resistance.

The second resin molding may contain at least one kind selected from among the group consisting of filler, diffusing agent, pigment, fluorescent material and reflective material mixed therein. Various materials are added in accordance to the requirement of the second resin molding. For example, a fluorescent material may be mixed in the second resin molding so as to achieve a color of light different from that of the light emitted by the light emitting device. White light can be produced by, for example, using a light emitting device which emits blue light and a fluorescent material which emits yellow light. In order to emit uniformly, filler and/or diffusing agent may also be mixed.

The present invention is a resin molding which integrally molds the first lead and the second lead, wherein the first lead has the first inner lead and the first outer lead with the first inner lead being placed in the resin molding and the first outer lead being exposed from the resin molding, the second lead has the second inner lead and the second outer lead with the second inner lead being placed in the resin molding and the second outer lead being exposed from the resin molding, while the resin molding has the recess comprising the bottom surface and the side face, the first inner lead and the second inner lead are exposed from the bottom surface of the recess of the resin molding, and the resin molding is formed from a thermosetting resin. This constitution makes it possible to provide better resin molding having higher heat resistance, higher light resistance and higher bonding strength than in the case of forming the resin molding from a thermoplastic resin. It is also made possible to make the structure where the light emitting device can be easily placed.

The present invention is a resin molding which integrally molds the first lead and the second lead, wherein the first lead has the first inner lead and the first outer lead with the first inner lead being placed in the resin molding and the first outer lead being exposed from the resin molding, the second lead has the second inner lead and the second outer lead with the second inner lead being placed in the resin molding and the second outer lead being exposed from the resin molding, while the resin molding has the recess comprising the bottom surface and the side surface, the first inner lead and the second inner lead are exposed from the bottom surface of the recess of the resin molding, the back side of the first inner lead which is opposite to the principal surface where the recess is formed is exposed from the resin molding, and the resin molding is formed from a thermosetting resin. This constitution makes it possible to provide the resin molding having higher heat resistance, higher light resistance and higher bonding strength than in the case of forming the resin molding from a thermoplastic resin. It is also made possible to make the structure where the light emitting device can be easily placed. Also by exposing the first outer lead which extends from the resin molding, heat generated from the light emitting device can be dissipated to the outside.

The exposed portion of the back side of the first lead and the exposed portion of the back side of the second lead preferably lie on substantially the same plane. This makes it possible to provide the surface mounted light emitting apparatus which uses the resin molding that has satisfactory stability and is easy to mount. It is also easy to mold by means of dies.

The thermosetting resin is preferably at least one kind selected from among the group consisting of epoxy resin, modified epoxy resin, silicone resin, modified silicone resin, acrylate resin and urethane resin. These materials enable it to provide the rein molding which has favorable property for mass production, higher heat resistance and higher light resistance at a low cost.

The resin molding is formed by the transfer molding process which is capable of forming recesses of complex shapes that are difficult to form by the injection molding process.

The resin molding may contain at least one kind selected from among the group consisting of filler, diffusing agent, pigment, fluorescent material, reflective material and light blocking material. Such additives enable it to provide the resin molding which satisfies specific requirements. For example, in case the resin molding which has light diffusion effect is desired, a filler and/or a diffusing agent are mixed. In case the surface mounted light emitting apparatus which converts the wavelength of light and emits light of a desired color is required, fluorescent material is mixed. In case it is desired to block the transmission of light to the back surface in order to efficiently extract light emitted by the light emitting device on the principal surface side, light blocking material is mixed.

The present invention is a method for manufacturing the resin molding which integrally molds the first lead and the second lead and has the recess comprising the bottom surface and the side face formed therein, wherein an upper die has a recess corresponding to the recess of the resin molding, the first lead has the first inner lead and the first outer lead, the second lead has the second inner lead and the second outer lead, the method comprising a first process where the first inner lead and the second inner lead corresponding to the bottom surface of the recess of the resin molding and the first outer lead and the second outer lead are interposed between the upper die and the lower die, a second process where the thermosetting resin is poured into the cavity formed between the upper die and the lower die by the transfer molding process, and a third process where the thermosetting resin which has been poured into the cavity is heated so as to be cured and form the resin molding.

With this method, since the first inner lead and the second inner lead are interposed between the upper die and the lower die in the first process, these leads can be suppressed from fluttering during the transfer molding process, so that the resin molding without burrs can be made. It is also made possible to expose the first inner lead which corresponds to the portion whereon the light emitting device is mounted. Moreover, since the principal surface side and the back side of the first inner lead corresponding to the bottom surface of the recess are exposed, heat can be dissipated from the back side when the light emitting device is mounted, thus improving the heat dissipation performance.

Also the resin molding which has the recess of complex shape can be made since it is formed from the thermosetting resin by the transfer molding process. The resin molding which has favorable property for mass production, higher heat resistance, higher light resistance and higher bonding strength can also be made. The thermosetting resin is once heated to the melting temperature, and is then cooled to solidify. Thus the thermoplastic resin and the thermosetting resin are subjected to different cooling processes, and are also different as to whether they can be cured reversibly. The thermoplastic resin has high viscosity during processing, and therefore cannot be formed into a complicated shape by molding.

The present invention is a method for manufacturing the surface mounted light emitting apparatus which comprises the first resin molding that integrally molds the first lead and the second lead and has the recess comprising the bottom surface and the side surface, the light emitting device mounted on the first lead and the second resin molding which covers the light emitting device, wherein the upper die has the recess corresponding to the recess of the first resin molding, the first lead has a first inner lead and the first outer lead, the second lead has the second inner lead and the second outer lead, the method comprising the first process where the first inner lead and the second inner lead corresponding to the bottom surface of the recess of the first resin molding and the first outer lead and the second outer lead are interposed between the upper die and the lower die, the second process where the first thermosetting resin is poured into the cavity formed between the upper die and the lower die by the transfer molding process, the third process where the first thermosetting resin which has been poured into the cavity is heated so as to be cured and form the first resin molding, the fourth process where the upper die is removed, the fifth process where the light emitting device is placed on the first inner lead with the first electrode of the light emitting device and the first inner lead being electrically connected with each other and the second electrode of the light emitting device and the second inner lead being electrically connected with each other, the sixth process where the second thermosetting resin is placed in the recess where the light emitting device is mounted, and the seventh process where the second thermosetting resin is heated so as to be cured and form the second resin molding. This method enables it to manufacture the surface mounted light emitting apparatus which has favorable property for mass production. Also because the first resin molding and the second molding are formed from the thermosetting resin, bonding strength between the first resin molding and the second molding can be made higher than in the case of using a thermoplastic resin and a thermosetting resin. When the first resin molding is formed by the transfer molding process, the leads are securely interposed by the upper die and the lower die so that burrs are not formed despite the high fluidity of the resin often cause the problem of burrs. Since the leads which are interposed are exposed, the light emitting device can be placed on the exposed portion or the electrodes of the light emitting device can be connected to the leads by wires.

The thermosetting resin, the first thermosetting resin and the second thermosetting resin are preferably at least one kind selected from among the group consisting of epoxy resin, modified epoxy resin, silicone resin, modified silicone resin, acrylate resin and urethane resin. This constitution enables it to manufacture the surface mounted light emitting apparatus which has favorable property for mass production. Also because these materials have high fluidity and can be easily heated and cured, the surface mounted light emitting apparatus having high heat resistance and high light resistance can be manufactured with satisfactory molding quality.

Figure 1:
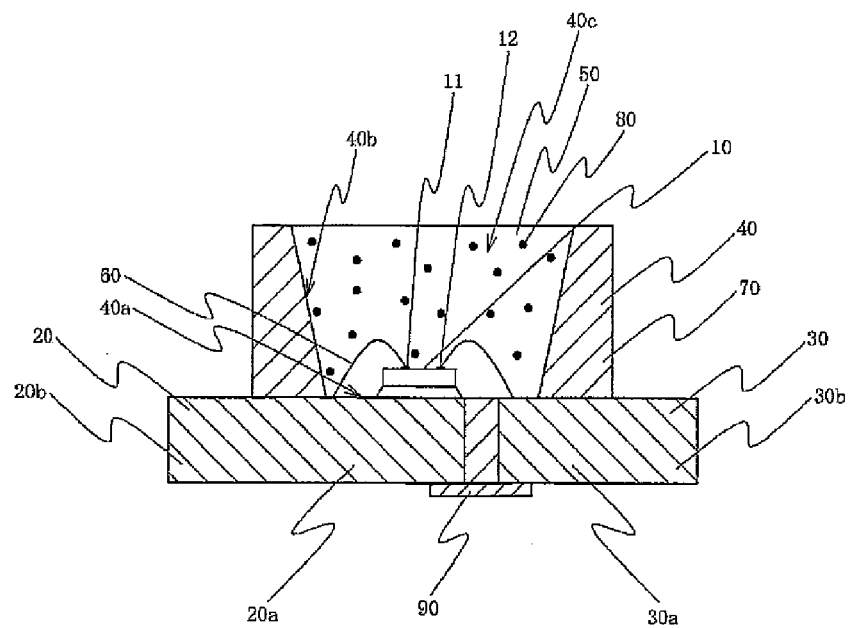
FIG. 1 is a schematic sectional view showing the surface mounted light emitting apparatus according to the first embodiment.

DESCRIPTION OF REFERENCE NUMERALS 10 light emitting device
11 first electrode
12 second electrode
20 first lead
20*a* first inner lead
20*b* first outer lead
30 second lead
30*a* second inner lead
30*b* second outer lead 40 first resin molding
40a bottom surface
40b side surface
40c recess
50 second resin molding
60 wire
70 filler
80 fluorescent material
90 insulating member
100 heat dissipating adhesive
110 heat sink
120 upper die
121 lower die
210 light emitting device
220 lead frame for mounting
230 lead frame for connection
240 molding
250 translucent encapsulant resin

DETAILED DESCRIPTION OF THE INVENTION

The surface mounted light emitting apparatus and the resin molding of the present invention and the methods for manufacturing the same will now be described by way of embodiments and Examples. However, the present invention is not limited to these embodiments and Examples.
First Embodiment
<Surface Mounted Light Emitting Apparatus>

Figure 2:
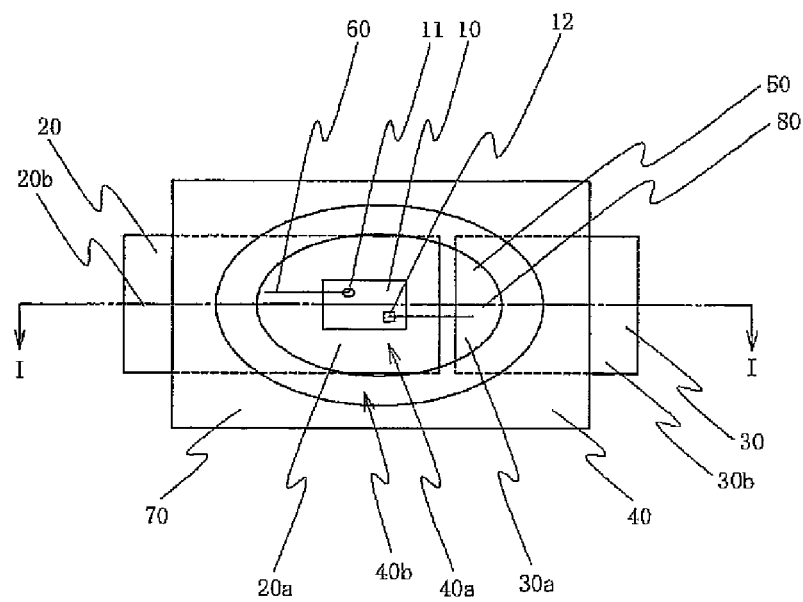
FIG. 2 is a schematic plan view showing the surface mounted light emitting apparatus according to the first embodiment.

The surface mounted light emitting apparatus according to the first embodiment will be described with reference to the accompanying drawings. FIG. 1 is a schematic sectional view showing the surface mounted light emitting apparatus according to the first embodiment. FIG. 2 is a schematic plan view showing the surface mounted light emitting apparatus according to the first embodiment. FIG. 1 is a schematic sectional view along line I-I of FIG. 2.

The surface mounted light emitting apparatus according to the first embodiment comprises a light emitting device 10, a first resin molding 40 whereon the light emitting device 10 is mounted and the second resin molding 50 which covers the light emitting device 10. The first resin molding 40 integrally molds the first lead 20 whereon the light emitting device 10 is mounted and the second lead 30 which is electrically connected to the light emitting device 10.

The light emitting device 10 has a pair of positive and negative electrodes, a first electrode 11 and a second electrode 12, provided on the same side. While a case of providing the pair of positive and negative electrodes on the same side is described in this specification, the present invention may also be applied to a case where a pair of positive and negative electrodes are provided on the top surface and the bottom surface of the light emitting device. In this case, the electrode provided on the bottom surface of the light emitting device is electrically connected to the first lead 20 by means of an electrically conductive die bonding member, without using a wire.

The first lead 20 has a first inner lead 20a and a first outer lead 20b. The light emitting device 10 is mounted on the first inner lead 20a via the die bonding member. The first inner lead 20a is electrically connected to the first electrode 11 of the light emitting device 10 via a wire 60. The first outer lead 20b is exposed from the first resin molding 40. While the first lead 20 has the first outer lead 20b provided on the outside of the side face of the first resin molding 40, the portion exposed on the back of the first resin molding 40 may also be called the first outer lead 20b, and the first outer lead 20b may be a portion which is electrically connected to the external electrode. The first lead 20 is formed from a metal so as to connect to the external electrode.

The second lead 30 has a second inner lead 30a and a second outer lead 30b. The second inner lead 30a is electrically connected to the second electrode 12 of the light emitting device 10 via the wire 60. The second outer lead 30b is exposed from the first resin molding 40. While the second lead 30 has the second outer lead 30b provided on the outside of the side face of the second resin molding 40, the portion exposed on the back of the second resin molding may also be called the second outer lead 30b, and the second outer lead 30b may be a portion which is electrically connected to the external electrode. The second lead 30 is formed from a metal so as to connect to the external electrode. An insulation member 90 is provided in a portion where the first lead 20 and the second lead 30 are located near to each other on the back side, in order to prevent the first lead 20 and the second lead 30 from short circuiting.

The first resin molding 40 has the recess 40c which has the bottom surface 40a and the side surface 40b. The first inner lead 20a of the first lead 20 is exposed from the bottom surface 40a of the recess 40c of the first resin molding 40. The light emitting device 10 is mounted on the exposed portion via the die bonding member. The first resin molding 40 is formed by transfer molding process. The first resin molding 40 is formed from a thermosetting resin. It is preferable that the opening of the recess 40c is made wider than the bottom 40a, and the side face 40b is inclined.

The second resin molding 50 is placed in the recess 40c so as to cover the light emitting device 10. The second resin molding 50 is formed from a thermosetting resin. The second resin molding 50 contains a fluorescent material 80. The fluorescent material 80 has a specific gravity higher than that of the second resin molding 50, and therefore precipitates on the bottom 40a of the recess 40c.

In this specification, the side where the light emitting device 10 is mounted is called the principal surface side, and the opposite side is called the back side.

The first resin molding 40 and the second resin molding 50 are formed from thermosetting resins and have physical properties which are proximate to each other, and therefore can bond with each other very well. The constitution described above enables it to provide the surface mounted light emitting apparatus having high heat resistance and high light resistance.

Constituent components will now be described below.
<Light Emitting Device>

The light emitting device 10 is made by forming a light emitting layer from a semiconductor such as GaAlN, ZnS, ZnSe, SiC, GaP, GaAlAs, AlN, InN, AllnGaP, InGaN, GaN or AllnGaN on a substrate. The structure of the semiconductor may be homo-junction structure, hetero-junction structure or double hetero-junction structure having MIS junction, PIN junction or PN junction. Wavelength range of the emitted light can be selected from a wide region ranging from ultraviolet to infrared, by selecting the components of the semiconductor layer and the mixing proportion thereof. The light emitting layer may be formed in a thin film which allows quantum effect to appear, having either single quantum well structure or multiple quantum well structure.

In consideration of outdoor use, it is preferable to use a gallium nitride-based compound semiconductor which enables it to form a light emitting device of high brightness. To obtain the emission of red light, it is preferable to use a semiconductor based on gallium, aluminum or arsenic, or a semiconductor based on aluminum, indium, gallium or phosphorus, although various other semiconductors may also be used depending on the application.

In case a gallium nitride-based compound semiconductor is used, sapphire, spinel, SiC, Si, ZnO or GaN single crystal or the like is used for the semiconductor substrate. Sapphire substrate is preferably used in order to form gallium nitride which has favorable property for mass production and high crystallinity. An example of the light emitting device 10 made by using nitride-based compound semiconductor is shown. A buffer layer is formed from GaN, AlN or the like on a sapphire substrate. A first contact layer of P or N type GaN, an active layer consisting of thin film of InGaN having quantum effect, a cladding layer of P or N type AlGaN and a second contact layer of P or N type GaN may be formed in this order on the buffer layer. The gallium nitride-based compound semiconductor shows N type conductivity when it is not doped with an impurity. In order to form an N type gallium nitride semiconductor of a desired property such as improved light emission efficiency, it is preferable to add Si, Ge, Se, Te, C or the like as N type dopant.

In order to form a P type gallium nitride semiconductor, Zn, Mg, Be, Ca, Sr, Ba or the like is added as P type dopant. Since gallium nitride semiconductor is difficult to turn into P type semiconductor simply by doping with P type dopant, it is necessary to anneal by heating in a furnace, irradiating with low electron beam or irradiating with plasma after introducing a P type dopant. A semiconductor wafer made in this way is subjected to partial etching and/or other process so as to form positive and negative electrodes. Then the semiconductor wafer is cut into desired size thereby making the light emitting devices.

The light emitting device 10 may be used in plurality, so as to achieve improved color-blending performance according to the combination in the display of white color. For example, two light emitting devices 10 which are capable of emitting green light and one light emitting device 10 which is capable of emitting blue light and one light emitting device 10 which is capable of emitting red light may be combined. For an application to a full-color display apparatus, it is preferable to have such a constitution that emits red light in a range of wavelengths from 610 nm to 700 nm, green light in a range of wavelengths from 495 nm to 565 nm and blue light in a range of wavelengths from 430 nm to 490 nm. In order to produce blended light of whitish color with the surface mounted light emitting apparatus of the present invention, it is preferable to have the light emitting device emit light in a range of wavelengths not shorter than 400 nm and not longer than 530 nm and more preferably not shorter than 420 nm and not longer than 490 nm, in consideration of the complementary color relation with the light emitted by the fluorescent material and degradation of the translucent resin. In order to improve the efficiency of excitation and emission by the light emitting device and the fluorescent material, the range of wavelengths is more preferably not shorter than 450 nm and not longer than 475 nm. A light emitting device which has principal wavelength of emission in ultraviolet region shorter than 400 nm or in a short wavelength region of visible light may be used in combination with a member which is less susceptible to degradation by ultraviolet rays.

The light emitting device 10 having size of 1 mm square can be mounted, and those having size of 600 μm square or 320 μm square can also be mounted.

<First Resin Molding>

The first resin molding 40 has the recess 40c comprising the bottom surface 40a and the side face 40b. The first resin molding 40 integrally molds the first lead 20 which extends from the bottom surface a of the recess 40c and the second lead 30. The first inner lead 20a of the first lead 20 forms a part of the bottom surface 40a of the recess 40c. The second inner lead 30a of the second lead 30 forms a part of the bottom surface 40a of the recess 40c, and is disposed at a predetermined distance from the first inner lead 20a. The light emitting device 10 is mounted on the first inner lead 20a which corresponds to the bottom surface 40a of the recess 40c. The first inner lead 20a which corresponds to the bottom surface 40a of the recess 40c, the second inner lead 30a which corresponds to the bottom surface 40a of the recess 40c, the first outer lead 20b and the second outer lead 30b are exposed from the first resin molding 40. The first lead 20 and the second lead 30 on the back side are exposed. This constitution enables it to establish electrical connection from the back side.

The recess 40c is formed with inclined surface so as to become wider toward the mouth. This configuration improves the efficiency of extracting light in the front direction. The recess 40c may be, however, formed in a tubular shape instead of being inclined. The inclined surface is preferably smooth, although may be roughened. Rough surface makes it possible to improve the bonding between the first resin molding 40 and the second resin molding 50. Angle of inclination of the recess 40c from the bottom surface is preferably from 95 to 150 degrees, more preferably from 100 to 120 degrees.

Shape of the first resin molding 40 on the principal surface side is rectangular, although it may also be oval, circle, pentagon, hexagon or other shape. Shape of the recess 40c on the principal surface side is oval, although it may also be substantially circular, rectangular, pentagon, hexagon or other shape. A cathode mark may be attached as required.

The material of the first resin molding 40 is a thermosetting resin. The first resin molding is preferably formed of at least one kind selected from among the group consisting of epoxy resin, modified epoxy resin, silicone resin, modified silicone resin, acrylate resin and urethane resin among the thermosetting resins, and epoxy resin, modified epoxy resin, silicone resin and modified silicone resin are particularly preferable. For example, it is possible to use a solid epoxy resin composition prepared by adding 0.5 parts by weight of DRU (1,8-diazabicyclo(5,4,0)undecene-7) (Chemical Formula 6) as a curing accelerator, 1 part by weight of ethylene glycol (Chemical Formula 7) as a promoter, 10 parts by weight of a titanium oxide pigment and 50 parts by weight of a glass fiber to 100 parts by weight of a colorless transparent mixture, which is prepared by dissolving and mixing an epoxy resin comprising triglycidyl isocyanurate (Chemical Formula 1), hydrogenated bisphenol A diglycidyl ether (Chemical Formula 2) and the like and an acid anhydride comprising hexahydrophthalic anhydride (Chemical Formula 3), 3-methylhexahydrophthalic anhydride (Chemical Formula 4), 4-methylhexahydrophthalic anhydride (Chemical Formula 5) and the like so that the acid anhydride is equivalent to the epoxy resin, and partially curing the mixture with heating, thereby B-staging the mixture.

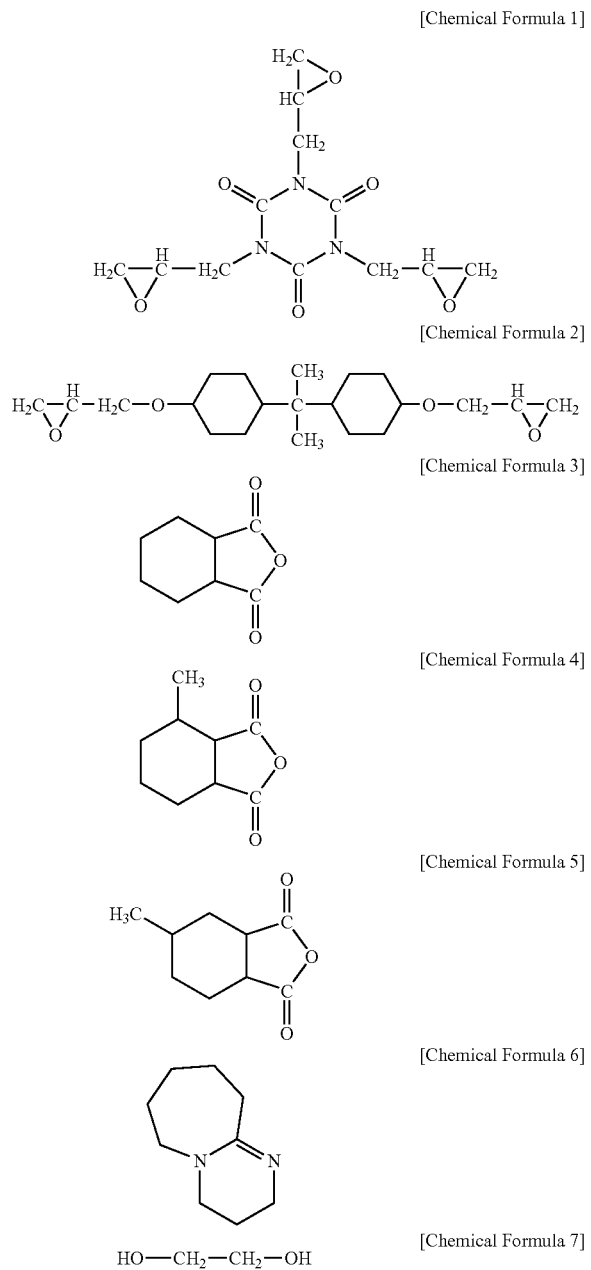

[Chemical Formula 1]

[Chemical Formula 2]

[Chemical Formula 3]

[Chemical Formula 4]

[Chemical Formula 5]

[Chemical Formula 6]

[Chemical Formula 7]

The first resin molding 40 is required to serve as a package, and is therefore preferably made of a hard material. Although the first resin molding 40 may or may not be translucent, it can be designed in accordance to the application. For example, a light blocking material may be mixed in the first resin molding 40 so as to reduce the light which transmits the first resin molding 40. A filler or a diffusing agent may also be mixed so that light emitted by the surface mounted light emitting apparatus emerges uniformly in the forward and sideways directions. A whitish pigment, rather than dark pigment, may also be added so as to reduce the absorption of light. In this way, the first resin molding 40 may contain at least one kind selected from among the group consisting of filler, diffusing agent, pigment, fluorescent material, reflective material and light blocking material mixed therein, so as to provide a desired function.

<First Lead, Second Lead>

The first lead 20 has the first inner lead 20a and the first outer lead 20b. The bottom surface 40a of the recess 40c of the first resin molding 40 in the first inner lead 20a is exposed, and the light emitting device 10 is mounted on the exposed portion. While the surface area required of the exposed first inner lead 20a may be such allows it to mount the light emitting device 10, the surface area is preferably larger when consideration is given to heat conductivity, electrical conductivity and reflectivity. The first inner lead 20a is electrically connected to the first electrode 11 of the light emitting device 10 via a wire 60. The first outer lead 20b is a portion which is exposed from the first resin molding 40, other than the portion where the light emitting device is mounted. The first outer lead 20b is electrically connected to the external electrode and also serves to transfer the heat.

The second lead 30 has the second inner lead 30a and the second outer lead 30b. The bottom surface 40a of the recess 40c of the first resin molding 40 in the second inner lead 30a is exposed. While the surface area required of the exposed second inner lead 30b may be such that allows it to electrically connect to the second electrode 12 of the light emitting device 10, the surface area is preferably larger when consideration is given to reflectivity. The first outer lead 20b and the second outer lead 30b on the back side are exposed and form a substantially the same plane. This configuration enables it to improve the stability of mounting of the surface mounted light emitting apparatus. In order to prevent the first inner lead 20a and the second inner lead 30a from short-circuiting on the back sides thereof when soldering, coating of a thin insulation member 90 may be provided. The insulation member 90 is made of a resin or the like.

The first lead 20 and the second lead 30 may be formed from a good electrical conductor such as iron, phosphor bronze, copper alloy or the like. In order to improve the reflectivity to light emitted by the light emitting device 10, the surfaces of the first lead 20 and the second lead 30 may be plated with a metal such as silver, aluminum, copper or gold. In order to improve the reflectivity of the surfaces of the first lead 20 and the second lead 30, these surfaces are preferably smooth. Heat dissipation may be improved by increasing the surface area of the first lead 20 and the second lead 30, which makes it possible to effectively suppress the temperature of the light emitting device 10 from rising, so that relatively large current can flow in the light emitting device 10. Heat dissipation can also be improved by increasing the thickness of the first lead 20 and the second lead 30. In this case, since it becomes difficult to bend or otherwise process the first lead 20 and the second lead 30, the first lead 20 and the second lead 30 are cut into predetermined sizes. When the thickness of the first lead 20 and the second lead 30 is increased, the first lead 20 and the second lead 30 become less likely to undergo deflection so that the light emitting device 10 can be easily mounted. When the first lead 20 and the second lead 30 are formed in thin plates, in contrast, it becomes easier to process the first lead 20 and the second lead 30 by bending into a desired shape.

The first lead 20 and the second lead 30 are a pair of positive and negative electrodes. While the number of each of the first lead 20 and the second lead 30 provided may be one, each may also be provided in plurality. When a plurality of the light emitting devices 10 are provided on the first lead 20, it is necessary to provide a plurality of the second leads 30.

<Second Resin Molding>

The second resin molding 50 is provided in order to protect the light emitting device 10 from force, dust and moisture coming from the outside. It also enables it to guide the light emitted by the light emitting device 10 efficiently to the outside. The second resin molding 50 is disposed in the recess 40c of the first resin molding 40.

The second resin molding 50 is formed from a thermosetting resin. Among thermosetting resins, at least one kind selected from among the group consisting of epoxy resin, modified epoxy resin, silicone resin, modified silicone resin, acrylate resin and urethane resin is preferably used. Among these resins, epoxy resin, modified epoxy resin, silicone resin and modified silicone resin are preferably used in particular. The second resin molding 50 is preferably formed from a hard material in order to protect the light emitting device 10. The second resin molding 50 is also preferably formed from a resin which has high heat resistance, high weatherability and high light resistance. The second resin molding 50 may contain at least one kind selected from among the group consisting of filler, diffusing agent, pigment, fluorescent material and reflective material mixed therein so as to provide a desired function. The second resin molding 50 may also contain a diffusing agent. For the diffusing agent, barium titanate, titanium oxide, aluminum oxide, silicon oxide or the like may be preferably used. An organic or inorganic dye or pigment may also be contained for the purpose of cutting off undesired wavelengths. The second resin molding 50 may also contain a fluorescent material 80 which absorbs light emitted by the light emitting device 10 and converts the wavelength thereof.

(Fluorescent Material)

The fluorescent material may be any one which absorbs light from a light emitting device 10 to convert into light having a different wavelength. For example, the fluorescent material is preferably at least one kind selected from among nitride-based fluorescent material, oxynitride-based fluorescent material and sialon-based fluorescent material, which are activated mainly with lanthanoid elements such as Eu and Ce; alkali earth halogen apatite fluorescent material, alkali earth metal boric acid halogen fluorescent material and alkali earth metal aluminate fluorescent material, which are activated mainly with lanthanoid elements such as Eu, and transition metal elements such as Mn; rare earth aluminate and rare earth silicate, which are activated mainly with alkali earth silicate, alkali earth sulfide, alkali earth thiogallate; alkali earth silicon nitride, germanate, or lanthanoid elements such as Ce; and organic and organic complexes activated mainly with lanthanoid elements such as Eu. Specific examples thereof include, but are not limited to, the followings.

Examples of the nitride-based fluorescent material activated mainly with lanthanoid elements such as Eu and Ce include $M_2Si_5N_8$:Eu and $CaAlSiN_3$:Eu (M represents at least one kind selected from among Sr, Ca, Ba, Mg and Zn). The nitride-based fluorescent material further includes $MSi_7N_{10}$:Eu, $M_{1.8}Si_5O_{0.2}N_8$:Eu and $M_{0.9}Si_7O_{0.1}N_{10}$:Eu (M represents at least one kind selected from among Sr, Ca, Ba, Mg and Zn), in addition to $M_2Si_5N_8$:Eu.

Examples of the oxynitride-based fluorescent material activated mainly with lanthanoid elements such as Eu and Ce include $NSi_2O_2N_2$:Eu (M represents at least one kind selected from among Sr, Ca, Ba, Mg and Zn).

Examples of the sialon-based fluorescent material activated mainly with lanthanoid elements such as Eu and Ce include $M_{p/2}Si_{12-p-q}Al_{p+q}O_qN_{16-p}$:Ce and N—Al—Si—O—N (M represents at least one kind selected from among Sr, Ca, Ba, Mg and Zn, q represents 0 to 2.5, and p represents 1.5 to 3).

Examples of the alkali earth halogen apatite fluorescent material activated mainly with lanthanoid elements such as Eu, and transition metal elements such as Mn include $M_5(PO_4)_3X$:R (M represents at least one kind selected from among Sr, Ca, Ba, Mg and Zn, X represents at least one kind selected from among F, Cl, Br and I, and R represents at least one of Eu, Mn, and Eu and Mn).

Examples of the alkali earth metal boric acid halogen fluorescent material include $M_2B_5O_9X$:R (M represents at least one kind selected from among Sr, Ca, Ba, Mg and Zn, X represents at least one kind selected from among F, Cl, Br and I, and R represents at least one of Eu, Mn, and Eu and Mn).

Examples of the alkali earth metal aluminate fluorescent material include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R and $BaMgAl_{10}O_{17}$:R (R represents at least one of Eu, Mn, and Eu and Mn).

Examples of the alkali earth sulfide fluorescent material include $La_2O_2S$:Eu, $Y_2O_2S$:Eu and $Gd_2O_2S$:Eu.

Examples of the rare earth aluminate fluorescent material activated mainly with lanthanoid elements such as Ce include YAG-based fluorescent materials represented by the composition formulas $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, $(Y, Gd)_3(Al, Ga)_5O_{12}$. Examples thereof further include $Tb_3Al_5O_{12}$:Ce and $Lu_3A_5O_{12}$:Ce in which a portion or all of Y is substituted with Tb, Lu or the like.

Examples of the other fluorescent material include ZnS:Eu, $Zn_2GeO_4$:Mn and $Mga_2S_4$:Eu (M represents at least one kind selected from Sr, Ca, Ba, Mg and Zn, and X represents at least one kind selected from among F, Cl, Br and I).

If desired, the above fluorescent materials can contain at least one kind selected from among Tb, Cu, Ag, Au, Cr, Nd, Dy, Co, Ni and Ti, in place of Eu or in addition to Eu.

Fluorescent materials other than those described above may also be used as long as similar performance and effect can be obtained.

The fluorescent material may be such that is excited by the light from the light emitting device 10 and emits yellow, reed, green or blue light, but may also be one that emits light of intermediate color, such as yellow, blue green or orange. The surface mounted light emitting apparatus which emits light of various colors can be manufactured by using these fluorescent materials in various combinations.

For example, blue light emitted by a GaN-based compound semiconductor is irradiated on a fluorescent material having composition of $Y_3Al_5O_{12}$:Ce or $(Y_{0.8}Gd_{0.2})_3Al_5O_{12}$:Ce which converts the wavelength of the light. The surface mounted light emitting apparatus can emit white light by blending the light emitted by the light emitting device 10 and light emitted by the fluorescent material 60.

For example, the surface mounted light emitting apparatus which emits white light with good color rendering property can be provided by using a fluorescent material 60 made of $CaSi_2O_2N_2$:Eu or $SrSi_2O_2N_2$:Eu which emits light of color from green to yellow, $(Sr, Ca)_5(PO_4)_3Cl$:Eu which emits blue light and $(Ca, Sr)_2Si_5N_8$:Eu which emits red light. This is because the desired white light can be achieved simply by varying the proportions of the first fluorescent material and the second fluorescent material, since light rays of red, blue and green colors which are the three primary colors are used.

<Other Components>

The surface mounted light emitting apparatus may be provided with a zener diode as a protective element. The zener diode made by mounted on the first lead 20 provided on the bottom surface 40a of the recess 40c separately from the light emitting device 10. The zener diode may also be mounted on the first lead 20 provided on the bottom surface 40a of the recess 40c, with the light emitting device 10 mounted thereon. The size may be 300 μm square besides 280 μm square.

The wire 60 electrically connects between the second electrode 12 of the light emitting device 10 and the second lead 30 and between the first electrode 11 of the light emitting device 10 and the first lead 20. The wire 60 is required to have high ohmic contact with the electrode of the light emitting device 10, high mechanical connectivity, high electrical conductivity and high heat conductivity. Heat conductivity is preferably 0.01 cal/(S) (cm$^2$) (° C./cm) or higher, and more preferably 0.5 cal/(S) (cm$^2$) (° C./cm) or higher. A wire is provided between a position right above the light emitting device 10 and a wire bonding area of plated wiring pattern, so as to establish electrical continuity.

The surface mounted light emitting apparatus of the present invention is provided with the constitution described above.

<Mounting of the Surface Mounted Light Emitting Apparatus>

Figure 3:
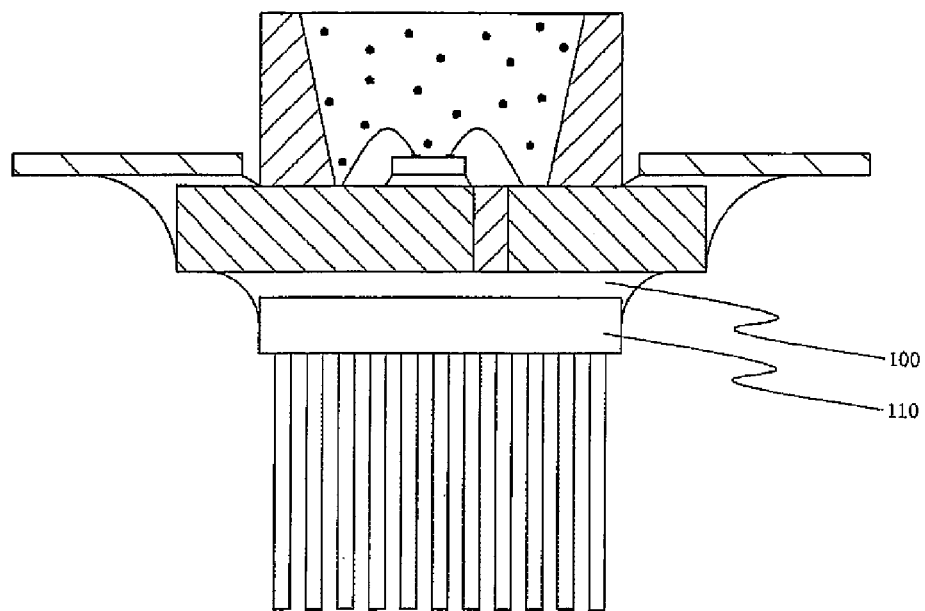
FIG. 3 is a schematic sectional view showing the state of mounting the surface mounted light emitting apparatus according to the first embodiment.

The surface mounted light emitting apparatus mounted in electrical connection with the external electrode is shown. FIG. 3 is a schematic sectional view showing the state of mounting the surface mounted light emitting apparatus according to the first embodiment.

A heat sink 110 can be provided via a heat conductive adhesive 100 on the back surface of the surface mounted light emitting apparatus. The heat conductive adhesive 100 preferable has heat conductivity higher than that of the material of the first resin molding 40. The heat conductive adhesive 100 may be formed from epoxy resin, silicone resin or the like which has electrically insulating property. The heat sink 110 is preferably made of aluminum, copper, tungsten, gold or the like which has high electrical conductivity. In addition, the heat sink 110 may be provided in contact only with the first lead 20 via the heat conductive adhesive 100 and eutectic metal containing solder having higher heat conductivity may be used as the heat conductive adhesive. Since the back surface of the surface mounted light emitting apparatus is smooth, it can be mounted on the heat sink 110 while maintaining stability. Particularly because the first lead 20 and the heat sink 110 are provided so as take the shortest possible path to the light emitting device 10, high heat dissipation is achieved.

The first outer lead 20b of the first lead 20 and the second outer lead 30b of the second lead 30 are electrically connected to external electrodes. The first lead 20 and the second lead 30 are thick flat plates, and are therefore electrically connected by interposing between the external electrode and the heat sink 90. Lead-free solder is used for electrical connection between the first outer lead 20b and the second outer lead 30b and the external electrode. Alternatively, electrical connection can also be established by placing the first outer lead 20b on the external electrode.

Second Embodiment

Figure 4:
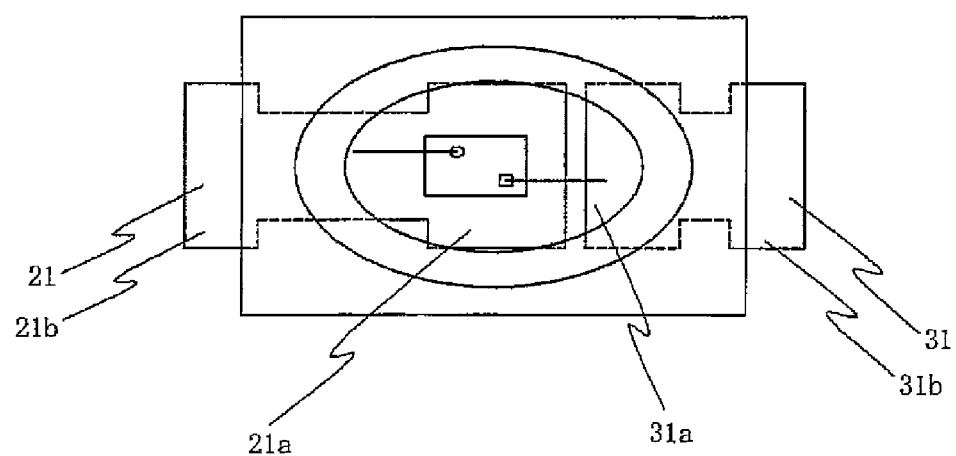
FIG. 4 is a schematic plan view showing the surface mounted light emitting apparatus according to the second embodiment.

The surface mounted light emitting apparatus according to the second embodiment will now be described. Aspects of the constitution similar to those of the surface mounted light emitting apparatus according to the first embodiment will be omitted. FIG. 4 is a schematic plan view showing the surface mounted light emitting apparatus according to the second embodiment.

In the surface mounted light emitting apparatus, surfaces of the first lead 21 and the second lead 31 are roughened so as to increase the contact area with the first resin molding 40. This makes it possible to prevent the first lead 21 and the second lead 31 from coming off the first resin molding 40.

Third Embodiment

Figure 5:
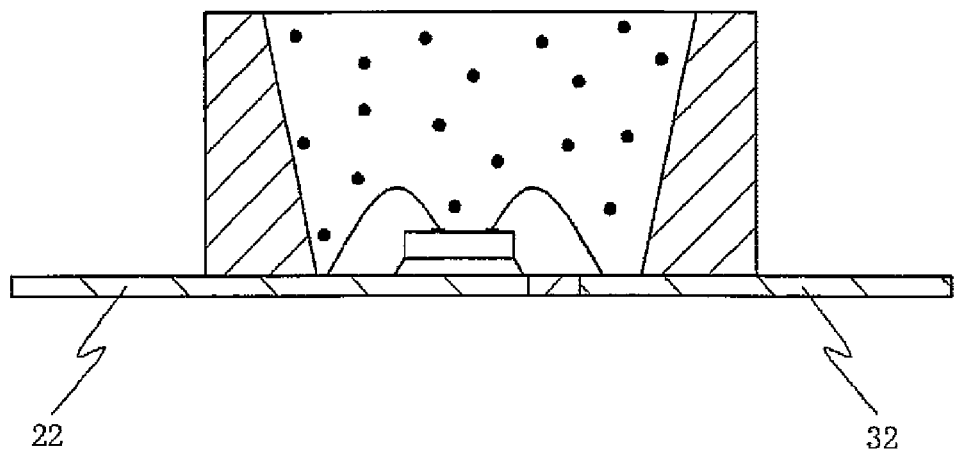
FIG. 5 is a schematic sectional view showing the surface mounted light emitting apparatus according to the third embodiment.

The surface mounted light emitting apparatus according to the third embodiment will now be described. Aspects of the constitution similar to those of the surface mounted light emitting apparatus of the first embodiment will be omitted. FIG. 5 is a schematic sectional view showing the surface mounted light emitting apparatus according to the third embodiment.

The surface mounted light emitting apparatus employs the first lead 22 and the second lead 32 which are formed in thin flat plates. This constitution makes it possible to provide the surface mounted light emitting apparatus of more compact and thin construction. The thin flat plate may be formed in rectangular shape as in the first embodiment, or may be roughened as in the second embodiment.

Fourth Embodiment

Figure 6:
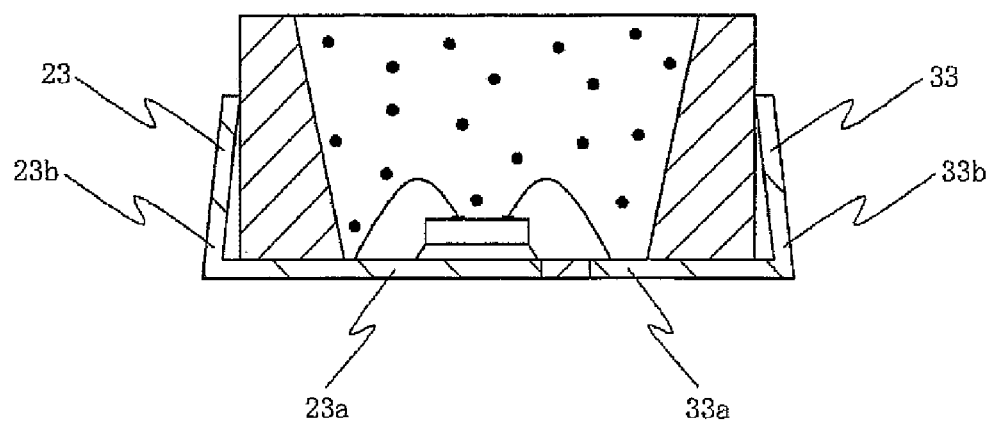
FIG. 6 is a schematic sectional view showing the surface mounted light emitting apparatus according to the fourth embodiment.

The surface mounted light emitting apparatus according to the fourth embodiment will now be described. Aspects of the constitution similar to those of the surface mounted light emitting apparatus of the third embodiment will be omitted. FIG. 6 is a schematic sectional view showing the surface mounted light emitting apparatus according to the fourth embodiment.

In the surface mounted light emitting apparatus, the first lead 23 and the second lead 33 are bent toward the principal surface. The first lead 23 and the second lead 33 are formed with small thickness, and therefore can be easily bent. This enables it for the solder to creep up to the first outer lead 23b and the second outer lead 33b which are bent when mounting, thereby firmly securing the members. During the transfer molding process in which the first resin is poured, since the first inner lead 23a and the second inner lead 33b are interposed between the upper die and the lower die, burrs are not formed even when the first inner lead 23a and the second inner lead 33b are formed with small thickness.

Fifth Embodiment

Figure 7:
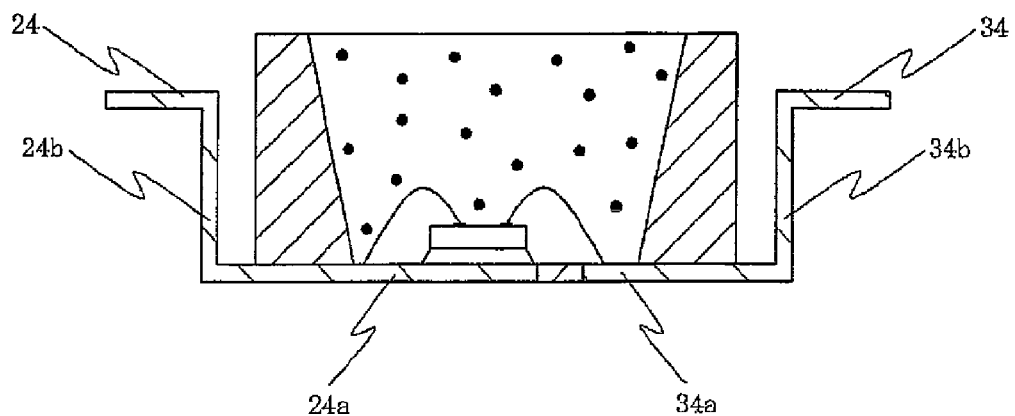
FIG. 7 is a schematic sectional view showing the surface mounted light emitting apparatus according to the fifth embodiment.
Figure 8:
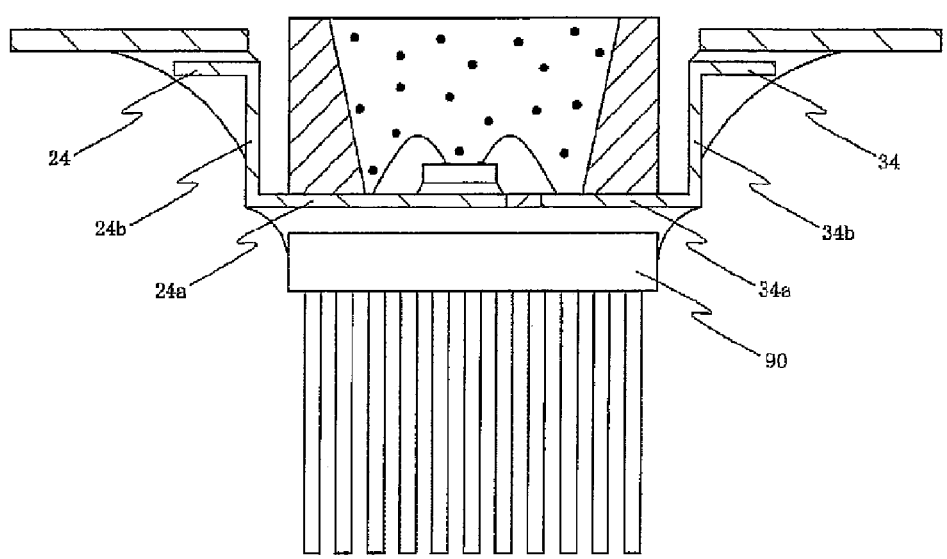
FIG. 8 is a schematic sectional view showing the state of mounting the surface mounted light emitting apparatus according to the third embodiment.

The surface mounted light emitting apparatus according to the fifth embodiment will now be described. Aspects of the constitution similar to those of the surface mounted light emitting apparatus of the third embodiment will be omitted. FIG. 7 is a schematic sectional view showing the surface mounted light emitting apparatus according to the fifth embodiment. FIG. 8 is a schematic sectional view showing the state of mounting the surface mounted light emitting apparatus according to the fifth embodiment.

In the surface mounted light emitting apparatus, the first outer lead 24b and the second outer lead 34b are bent toward the principal surface, and are further bent toward the outside. With this configuration, since the surface mounted light emitting apparatus can be interposed between the heat sink 90 and the external electrode, it is made easier to mount the surface mounted light emitting apparatus and stability of mounting is improved. The positions of connecting the first lead 24 and the second lead 34 to the external electrode can be made higher than the positions of fastening the first lead 24 and the second lead 34 to the heat sink 90. As a result, since the entire surface mounted light emitting apparatus except for the light emitting surface can be concealed from the mounting substrate, the mounting substrate can be efficiently used as a reflector.

Sixth Embodiment

Figure 9:
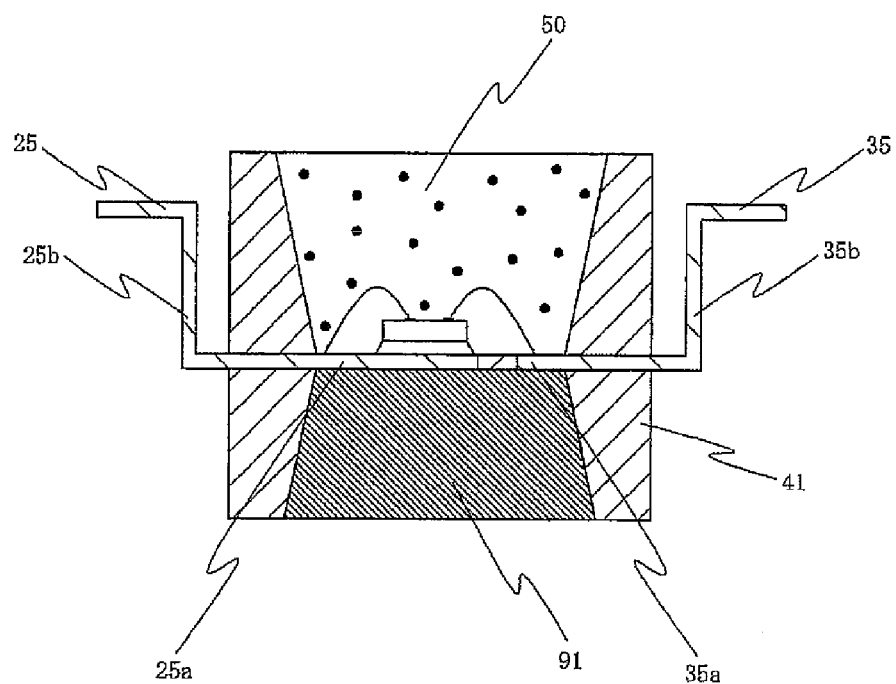
FIG. 9 is a schematic sectional view showing the surface mounted light emitting apparatus according to the sixth embodiment.

The surface mounted light emitting apparatus according to the sixth embodiment will now be described. Aspects of the constitution similar to those of the surface mounted light emitting apparatus of the third embodiment will be omitted. FIG. 9 is a schematic sectional view showing the surface mounted light emitting apparatus according to the sixth embodiment.

The surface mounted light emitting apparatus has the heat sink 91 incorporated in the first resin molding 41. The heat sink 91 is disposed on the back surface of the first inner lead 25a. This configuration enables it to provide the surface mounted light emitting apparatus which has the heat sink 91 integrated therein. It also eliminates the necessity of separately attaching the heat sink 91 and the necessity to consider the bonding between the surface mounted light emitting apparatus and the heat sink 91. By disposing the heat sink 91 so as to be substantially flush with the back surface of the resin molding 41, stabilization of the surface mounted light emitting apparatus is improved. The first outer lead 25b and the second outer lead 35b are bent in a predetermined shape.

In this surface mounted light emitting apparatus, the first inner lead 25a and the second inner lead 35a are interposed between the upper die and the lower die, and predetermined recesses are provided on the principal surface side and the back side of the first inner lead 25a and the second inner lead 35a. This constitution enables it to more effectively prevent the first inner lead 25a and the second inner lead 35a from coming off. It is also enabled to provide the surface mounted light emitting apparatus having predetermined thickness.

<Method for Manufacturing Surface Mounted Light Emitting Apparatus>

The method of manufacturing the surface mounted light emitting apparatus of the present invention will now be described. This manufacturing method is related to the surface mounted light emitting apparatus described above. FIGS. 10(a) through 10(e) are schematic sectional views showing the processes of manufacturing the surface mounted light emitting apparatus of the first embodiment.

The first inner lead 20a and the second inner lead 30a corresponding to the bottom surface 40a of the recess 40c of the first resin molding 40 and the first outer lead 20b and the second outer lead 30b are interposed between the upper die 120 and the lower die 121 (first process).

The upper die 120 has a recess corresponding to the recess of the first resin molding. The portion of the upper die 120 which corresponds to the bottom surface 40a of the recess 40c of the first resin molding 40 is formed so as to bring the first inner lead 20a and the second inner lead 30a into contact with each other.

The first thermosetting resin is poured into the recess interposed between the upper die 120 and the lower die 121 by the transfer molding process (second process).

In the transfer molding process, the first thermosetting resin in the form of pellets having predetermined size is put into a predetermined container. A pressure is applied to the container. The first thermosetting resin in molten state is poured into the recess interposed between the upper die 120 and the lower die 121 which communicates with the container. Then the upper die 120 and the lower die 121 are heated to a predetermined temperature, so as to cure the first thermosetting resin that has been poured therein. The series of these operations is called the transfer molding process.

Since the first inner lead 20a and the second inner lead 30a are interposed between the upper die and the lower die, the first inner lead 20a and the second inner lead 30a can be suppressed from fluttering during the transfer molding process, so that the resin molding without burrs can be made.

As the first thermosetting resin which has been poured is heated to cure, the first resin molding 40 is formed (third process).

Thus the first resin molding 40 is formed from the thermosetting resin. This provides a package which has high heat resistance, high light resistance and high bonding strength. And the first resin molding 40 formed from the thermosetting resin having the recess 40c comprising the bottom surface 40a and the side surface 40b is provided.

Then the upper die 120 and the lower die 121 are removed (fourth process).

The upper die 120 and the lower die 121 are removed in order to mount the light emitting device 10. When the resin has not been cured enough, additional curing treatment is applied so as to increase the mechanical strength of the resin molding 40 to a level that allows the subsequent operations.

The light emitting device 10 is mounted on the first inner lead 20a. The first electrode 11 of the light emitting device 10 and the first inner lead 20a are electrically connected with each other. The second electrode 12 of the light emitting device 10 and the second inner lead 20b are electrically connected with each other (fifth process).

The first electrode 11 and the first inner lead 20a are electrically connected via the wire 60. In case the light emitting device 10 has electrodes on the top surface and the bottom surface thereof, however, the electrical connection is made by die bonding only, instead of using the wire. Then the second electrode 12 and the second inner lead 30a are electrically connected via the wire 60.

The second thermosetting resin is placed in the recess 40c wherein the light emitting device 10 is mounted (sixth process).

While the second thermosetting resin may be placed by dripping, injection, extrusion or other methods, dripping is preferably employed. Dripping enables it to effectively purge air which remains in the recess 40c. The second thermosetting resin preferably contains the fluorescent material 80 mixed therein, which makes it easy to control the color tone of light emitted by the surface mounted light emitting apparatus.

As the second thermosetting resin is heated to cure, the second resin molding is formed (seventh process).

Thus the surface mounted light emitting apparatus can be made easily. As the first resin molding 40 and the second resin molding 50 are formed from thermosetting resins, the surface mounted light emitting apparatus having high bonding property can be provided. There occurs no peel-off in the interface between the first resin molding 40 and the second resin molding 50, and the surface mounted light emitting apparatus which has high heat resistance, high light resistance and high bonding strength is provided.

Example 1

The surface mounted light emitting apparatus of Example 1 is shown in FIG. 1 and FIG. 2. Aspects of the constitution similar to those of the surface mounted light emitting apparatus of the first embodiment will be omitted.

The surface mounted light emitting apparatus of Example 1 comprises the light emitting device 10, the first resin molding 40 on which the light emitting device 10 is placed and the second resin molding 50 which covers the light emitting device 10. The first resin molding 40 molds integrally the first lead 20 whereon the light emitting device 10 is mounted and the second lead 30 which is electrically connected to the light emitting device 10. The first resin molding 40 has the recess 40c which has the bottom surface 40a and the side surface 40b, while the opening of the recess 40c is made wider than the bottom surface 40a, and the side surface 40b is inclined.

The light emitting device 10 is made of GaN semiconductor which emits blue light. The light emitting device 10 has the first electrode 11 and the second electrode 12 provided on the same surface, and is bonded onto the first lead 20 in face-up position by using a die bonding resin (epoxy resin containing silver mixed therein). The first electrode 11 is electrically connected to the first lead 20 via the gold wire 60. The second electrode 12 is also electrically connected to the second lead 30 via the gold wire 60. The first lead 20 and the second lead 30 are made of copper, and the portions thereof exposed from the first resin molding 40 are plated with silver. The first lead 20 and the second lead 30 are made of relatively thick (about 0.5 mm) sheets, and back sides of the first lead 20 and the second lead 30 are exposed. The first resin molding 40 is formed by mixing 100 parts by weight of a mixture in equivalent weight proportions of an epoxy resin consisting of triglycidyl isocyanurate and an acid anhydride consisting of hexahydrophthalic anhydride, 0.5 parts by weight of DBU, 1 part by weight of ethylene glycol, 10 parts by weight of a titanium oxide pigment and 50 parts by weight of a glass fiber. The second resin molding 50 is formed from a silicone resin. The second resin molding 50 contains the YAG fluorescent material 80 having the composition of $(Y_{0.8}Gd_{0.2})_3Al_5O_{12}$:Ce mixed uniformly therein. The second resin molding 50 is placed in the recess 40c which has the bottom surface 40a and the side face 40b, and the surface of the second resin molding 50 is made flush with the top surface of the recess 40c. With this constitution, quantity of the fluorescent material 80 is controlled constant among products. The insulating member 90 comprising an epoxy resin sheet of predetermined thickness is adhered onto the back sides of the first lead 20 and the second lead 30.

Figure 10:
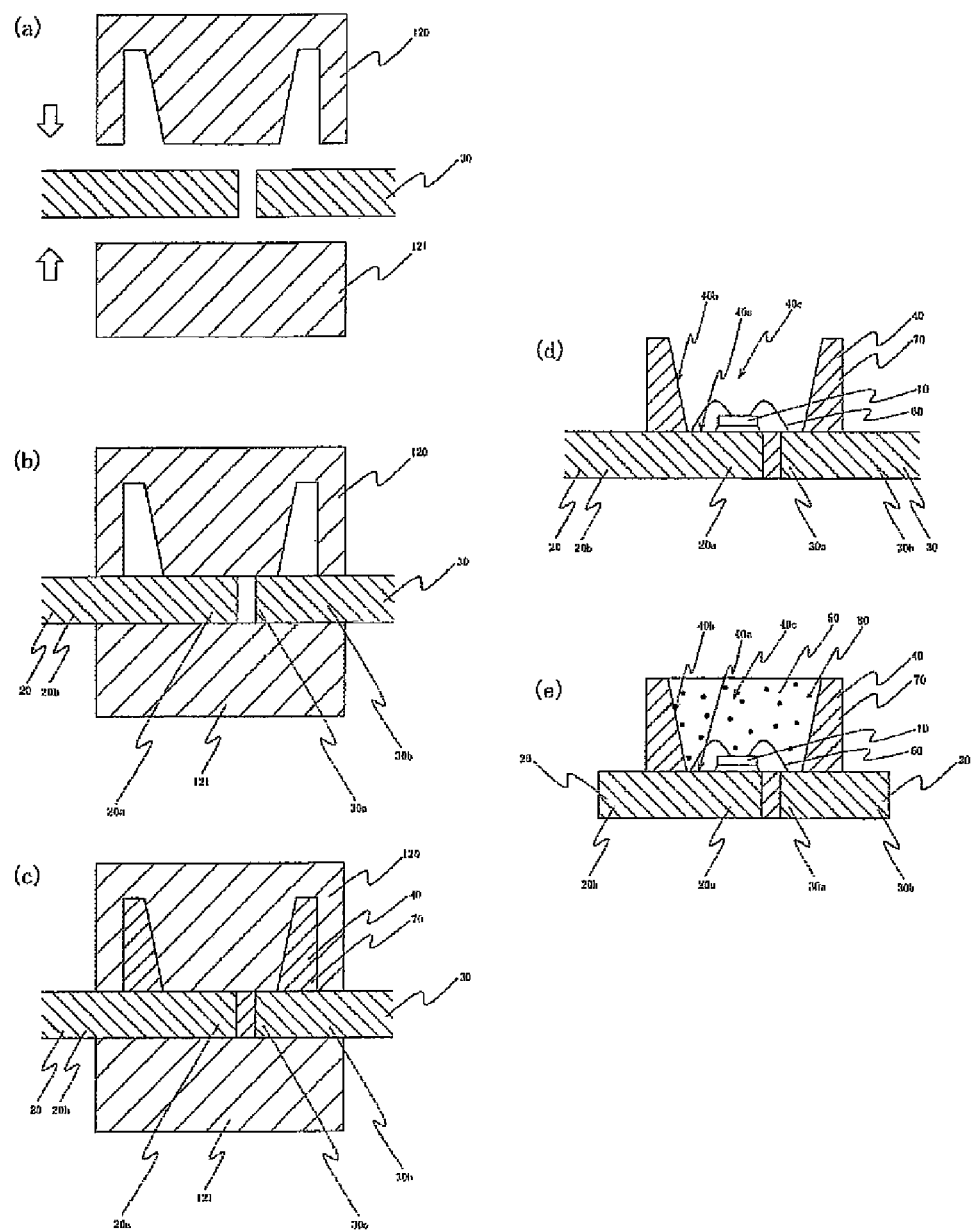
FIGS. 10(*a*) through 10(*e*) are schematic sectional views showing the processes of manufacturing the surface mounted light emitting apparatus of the first embodiment.
Figure 11:
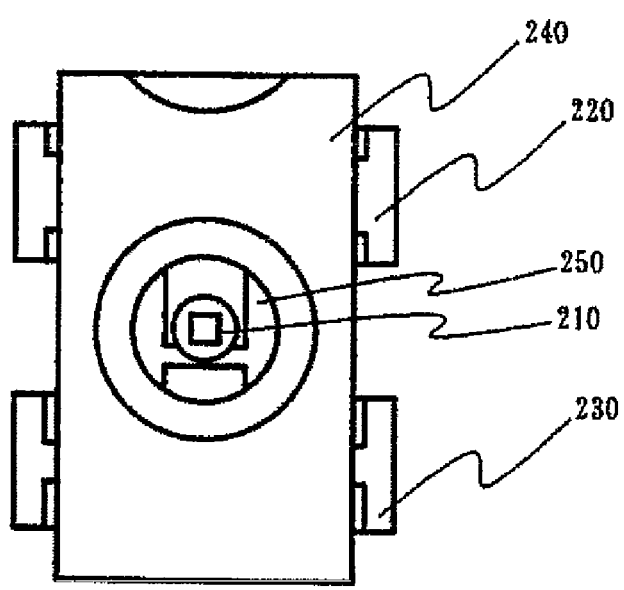
FIG. 11 is a schematic plan view showing the surface mounted light emitting apparatus of the prior art.
Figure 12:
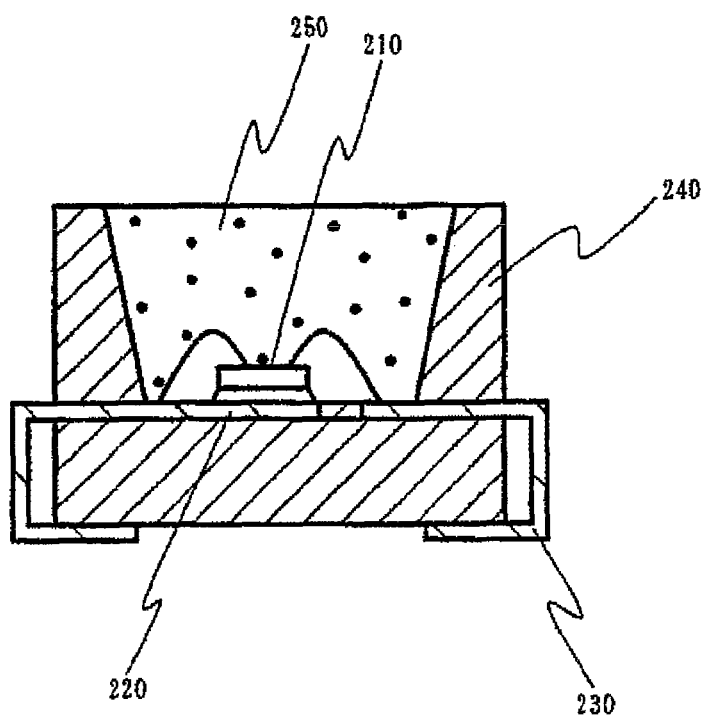
FIG. 12 is a schematic section view showing the surface mounted light emitting apparatus of the prior art.

The surface mounted light emitting apparatus of the Example 1 is manufactured by the processes described below. FIG. 10 is schematic sectional view showing the processes of manufacturing the surface mounted light emitting apparatus of Example 1.

Predetermined lead frame is punched through, and plurality of the first leads 20 and the second leads 30 are provided. The lead frame is secured onto the lower die 121 which is heated to about 150° C. The upper die 120 which is similarly heated to about 150° C. is placed so as to interpose the lead frame. Portions which are interposed are those corresponding to the inner leads 20a, 30a and the outer leads 20b, 30b of the first lead 20 and the second lead 30. Tablets obtained by punching the epoxy resin compound corresponding to the first resin molding 40 are placed in a die cylinder. The tablets are poured into the die by means of a piston (transfer molding process). The epoxy resin which has been poured is heated to about 150° C. for about 3 minutes in the die for preliminary curing. Then the upper die 120 and the lower die 121 are separated and the semi-cured epoxy resin compound is taken out of the dies. The resin molding is again heated to about 150° C. for about 3 hours so as to fully cure. Thus the lead frame which molds the first resin molding 40 with the fully cured epoxy resin compound integrally formed with the lead frame is obtained. The first resin molding 40 has the recess 40c which has the bottom surface 40a and the side surface 40b, and the lead frame is exposed on the bottom surface 40a. Portions of the lead frame corresponding to the outer leads 20b, 30b are plated.

Then the light emitting device 10 is die-bonded onto the bottom surface 40a of the recess 40c. The first electrode 11 of the light emitting device 10 and the first inner lead 20a of the first lead 20, and the second electrode 12 of the light emitting device 10 and the second inner lead 30a of the second lead 30 are electrically connected with each other via the wires 60.

Then the silicone resin corresponding to the second resin molding 50 which contains the YAG fluorescent material 80 mixed uniformly therein is dripped into the recess 40c up to the top surface thereof. The YAG fluorescent material 80 settles according to factors such as the viscosity of the silicone resin. As the YAG fluorescent material 80 settles, the YAG fluorescent material 80 can be disposed around the light emitting device 10, thereby providing the surface mounted light emitting apparatus having the desired color tone of light emission. After the silicone resin has been dripped, it is cured to obtain the second resin molding 50.

Last, the lead frame is cut off at predetermined positions, so as to form the first outer lead 20b and the second outer lead 30b. This completes the surface mounted light emitting apparatus of Example 1.

The surface mounted light emitting apparatus of the present invention can be used in illumination apparatus, display, backlight for mobile phone, flash light of camera, auxiliary light source for illumination and the like.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description but is only limited by the scope of the appended claims.

What is claimed is:

1. A surface mounted light emitting apparatus comprising:
a light emitting device,
a first resin molding which integrally molds a first lead whereon the light emitting device is mounted and a second lead which is electrically connected to the light emitting device, and
a second resin which covers the light emitting device,
wherein the first resin molding has a single recess for receiving said light emitting device, said recess comprising, in a cross-sectional view, a single bottom surface and a single side surface at each side of the recess made from the first resin molding, a shape of said recess at the single bottom surface being substantially oval, circular, rectangular, pentagon or hexagon, a front face of the first lead and a front face of the second lead being exposed from the first resin molding at the single bottom surface of the recess, with the light emitting device being mounted on the exposed portion of the first lead, said single side surface continuously maintaining a substantially constant inclination from a top of said recess to said single bottom surface; and
the first resin molding and the second resin are formed from thermosetting resins, and the first resin molding includes at least one kind selected from the group consisting of silicon oxide, diffusing agent, pigment, fluorescent material, reflective material and light blocking material, and
wherein said first resin molding is disposed between the first lead and the second lead, wherein each of the first lead and the second lead has a single back side that is opposite to the bottom surface of the recess where the light emitting device is mounted, said single back side being exposed from the first resin molding, and wherein both of said first lead and said second lead have a plate-like shape with a substantially constant thickness, and the thickness of said first lead and the thickness of the second lead are substantially the same.

2. The surface mounted light emitting apparatus according to claim 1, wherein
the second lead has a single back side that is opposite to the bottom surface of the recess, and
wherein said single back side of the second lead is exposed from the first resin molding.

3. The surface mounted light emitting apparatus according to claim 1, wherein
at least a part of an exposed portion of said single back side of the first lead, and
at least a part of an exposed portion of a back side of the second lead, and
at least a part of a back side of the first resin lie on substantially the same plane to form a continuous flat plane.

4. The surface mounted light emitting apparatus according to claim 1, wherein an exposed portion of the back side of the first inner lead is disposed so that a heat sink touches thereon.

5. The surface mounted light emitting apparatus according to claim 1, wherein the first resin molding is formed by transfer molding process.

6. The surface mounted light emitting apparatus according to claim 1, wherein the first resin molding is formed from at least one kind selected from the group consisting of epoxy resin, modified epoxy resin, silicone resin, modified silicone resin, acrylate resin and urethane resin.

7. The surface mounted light emitting apparatus according to claim 1, wherein the second resin molding includes at least one kind selected from the group consisting of filler, diffusing agent, pigment, fluorescent material and reflective material.

8. The surface mounted light emitting apparatus according to claim 1, wherein said thermosetting resin of the first resin molding integrally molds said first lead and said second lead.

9. The surface mounted light emitting apparatus according to claim 1, wherein said first resin molding disposed between the first lead and the second lead separates the first lead from the second lead below the recess.

10. The surface mounted light emitting apparatus according to claim 1, wherein the front face of the first lead, the front face of the second lead and a front face of the first resin molding disposed between the first lead and the second lead are on the same plane at the single bottom surface of said recess.

11. The surface mounted light emitting apparatus according to claim 1, wherein the single bottom surface of said recess is flat.

12. The surface mounted light emitting apparatus according to claim 1, wherein an inclination angle between the side surface and the single bottom surface of said recess is 95 to 150 degree.

13. The surface mounted light emitting apparatus according to claim 1, wherein a surface of said first lead and a surface of said second lead are roughened so as to increase a contact area with the first resin molding.

14. The surface mounted light emitting apparatus according to claim 1, wherein the second lead has a single back side that is opposite to the bottom surface of the recess where the light emitting device is mounted, said back side of the second lead being exposed from the first resin molding, and wherein a resin insulation member extends between and touches portions of the respective back sides of said first lead and said second lead, to prevent short-circuiting between the respective back sides of said first lead and said second lead.

15. A surface mounted light emitting apparatus comprising:
a light emitting device,
a first resin molding which integrally molds a first lead whereon the light emitting device is mounted and a second lead which is electrically connected to the light emitting device, and
a second resin which covers the light emitting device,
wherein the first lead has a first inner lead and a first outer lead with the first inner lead having the light emitting device mounted thereon and being electrically connected to a first electrode of the light emitting device, and the first outer lead being exposed from the first resin molding;
the second lead has a second inner lead and a second outer lead with the second inner lead being electrically connected to a second electrode of the light emitting device and the second outer lead being exposed from the first resin molding;
the first resin molding has a single recess for receiving said light emitting device, said recess comprising, in a cross-sectional view, a single bottom surface and a single side surface at each side of the recess made from the first resin molding, a shape of said recess at the single bottom surface being substantially oval, circular, rectangular, pentagon or hexagon, a front face of the first inner lead and a front face of the second inner lead being exposed from the first resin molding at the single bottom surface of the recess, with the light emitting device being mounted on the exposed portion of the first inner lead, said single side surface continuously maintaining a substantially constant inclination from a top of said recess to said single bottom surface;
the first resin molding and the second resin are formed from thermosetting resins, and the first resin molding includes at least one kind selected from the group consisting of silicon oxide, diffusing agent, pigment, fluorescent material, reflective material and light blocking material, and
wherein said first resin molding is disposed between the first inner lead and the second inner lead,
wherein each of the first lead and the second lead has a single back side that is opposite to the bottom surface of the recess where the light emitting device is mounted, and said single back side is exposed from the first resin molding, and
wherein both of said first lead and said second lead have a plate-like shape with a substantially constant thickness, and the thickness of said first lead and the thickness of the second lead are substantially the same.

16. The surface mounted light emitting apparatus according to claim 15, wherein
the first lead has a single back side that is opposite to the bottom surface of the recess where the light emitting device is mounted,
the second lead has a single back side that is opposite to the bottom surface of the recess, and wherein said single back side of the first lead and said single back side of the second lead are exposed from the first resin molding.

17. The surface mounted light emitting apparatus according to claim 15, wherein
a back side of the first inner lead, and
a back side of the second inner lead, and
at least a part of a back side of the first resin molding lie on substantially the same plane.

18. The surface mounted light emitting apparatus according to claim 15, wherein an exposed portion of the back side of the first inner lead is disposed so that a heat sink touches thereon.

19. The surface mounted light emitting apparatus according to claim 15, wherein the first resin molding is formed by transfer molding process.

20. The surface mounted light emitting apparatus according to claim 15, wherein the first resin molding is formed from at least one kind selected from the group consisting of epoxy resin, modified epoxy resin, silicone resin, modified silicone resin, acrylate resin and urethane resin.

21. The surface mounted light emitting apparatus according to claim 15, wherein the second resin molding includes at least one kind selected from the group consisting of filler, diffusing agent, pigment, fluorescent material and reflective material.

22. The surface mounted light emitting apparatus according to claim 15, wherein said thermosetting resin of the first resin molding integrally molds said first lead and said second lead.

23. The surface mounted light emitting apparatus according to claim 15, wherein said first resin molding disposed between the first inner lead and the second inner lead separates the first inner lead from the second inner lead below the recess.

24. The surface mounted light emitting apparatus according to claim 15, wherein the front face of the first inner lead, the front face of the second inner lead and a front face of the first resin molding disposed between the first inner lead and the second inner lead are on the same plane at the single bottom surface of said recess.

25. The surface mounted light emitting apparatus according to claim 15, wherein the single bottom surface of said recess is flat.

26. The surface mounted light emitting apparatus according to claim 15, wherein an inclination angle between the side surface and the single bottom surface of said recess is 95 to 150 degree.

27. The surface mounted light emitting apparatus according to claim 15, wherein a surface of said first lead and a surface of said second lead are roughened so as to increase a contact area with the first resin molding.

28. The surface mounted light emitting apparatus according to claim 15,
wherein the second lead has a single back side that is opposite to the bottom surface of the recess where the light emitting device is mounted, said back side of the second lead being exposed from the first resin molding, and
wherein a resin insulation member extends between and touches portions of the respective back sides of said first lead and said second lead, to prevent short-circuiting between the respective back sides of said first lead and said second lead.

29. A resin molding which integrally molds a first lead and a second lead, wherein the first lead has a first inner lead and a first outer lead with the first inner lead being placed in the resin molding and the first outer lead being exposed from the resin molding;
the second lead has a second inner lead and a second outer lead with the second inner lead being placed in the resin molding and the second outer lead being exposed from the resin molding,
the resin molding has a single recess formed therein for receiving a light emitting device, the recess comprising, in a cross-sectional view, a single bottom surface and a single side surface at each side of the recess made from the resin molding, a shape of said recess at the single bottom surface being substantially oval, circular, rectangular, pentagon or hexagon, and a front face of the first inner lead and a front face of the second inner lead being exposed from the resin molding at the bottom surface of the recess, said single side surface continuously maintaining a substantially constant inclination from a top of said recess to said single bottom surface, and
the first inner lead has a single back side that is opposite to the bottom surface of the recess,
the second inner lead has a single back side that is opposite to the bottom surface of the recess, and
said single back side of the first inner lead and said single back side of the second inner lead are exposed from the resin molding; and
the resin molding is formed from a thermosetting resin, and the resin molding includes at least one kind selected from the group consisting of silicon oxide, diffusing agent, pigment, fluorescent material, reflective material and light blocking material,
wherein said resin molding is disposed between the first lead and the second lead, and
wherein both of said first lead and said second lead have a plate-like shape with a substantially constant thickness, and the thickness of said first lead and the thickness of the second lead are substantially the same.

30. The resin molding according to claim 29, wherein
a back side of the first inner lead, and
a back side of the second inner lead, and
at least a part of a back side of the first resin molding lie on substantially the same plane.

31. The resin molding according to claim 29, wherein the thermosetting resin is at least one kind selected from the group consisting of epoxy resin, modified epoxy resin, silicone resin, modified silicone resin, acrylate resin and urethane resin.

32. The resin molding according to claim 29, wherein the resin molding is formed by transfer molding process.

33. The resin molding according to claim 29, wherein said thermosetting resin of the resin molding integrally molds said first lead and said second lead.

34. The resin molding according to claim 29, wherein said resin molding disposed between the first lead and the second lead separates the first lead from the second lead below the recess.

35. The resin molding according to claim 29, wherein the front face of the first inner lead, the front face of the second inner lead and a front face of said resin molding disposed between the first inner lead and the second inner lead are on the same plane at the single bottom surface of said recess.

36. The resin molding according to claim 29, wherein the single bottom surface of said recess is flat.

37. The resin molding according to claim 29, wherein an inclination angle between the side surface and the single bottom surface of said recess is 95 to 150 degree.

38. The resin molding according to claim 29, wherein a surface of said first lead and a surface of said second lead are roughened so as to increase a contact area with the first resin molding.

39. The resin molding according to claim 29,
wherein the second lead has a single back side that is opposite to the bottom surface of the recess where the light emitting device is mounted, said back side of the second lead being exposed from the first resin molding, and
wherein a resin insulation member extends between and touches portions of the respective back sides of said first lead and said second lead, to prevent short-circuiting between the respective back sides of said first lead and said second lead.

40. A resin molding which integrally molds a first lead and a second lead, wherein
the first lead has a first inner lead and a first outer lead with the first inner lead being placed in the resin molding and the first outer lead being exposed from the resin molding,
the second lead has a second inner lead and a second outer lead with the second inner lead being placed in the resin molding and the second outer lead being exposed from the resin molding to the outside;
the resin molding has a single recess for receiving a light emitting device, said recess comprising, in a cross-sectional view, a single bottom surface and a single side surface at each side of the recess made from the resin molding, a shape of said recess at the single bottom surface being substantially oval, circular, rectangular, pentagon or hexagon, a front face of the first inner lead and a front face of the second inner lead are exposed from the resin molding at the bottom surface of the recess of the resin molding, and each of the first lead and the second lead has a single back side that is opposite to the bottom surface of the recess, wherein said single back side is exposed from the resin molding, and said single side surface continuously maintains a substantially constant inclination from a top of said recess to said single bottom surface;
the resin molding is formed from a thermosetting resin, and the resin molding includes at least one kind selected from the group consisting of silicon oxide, diffusing agent, pigment, fluorescent material, reflective material and light blocking material,
wherein said resin molding is disposed between the first inner lead and the second inner lead, and
wherein both of said first lead and said second lead have a plate-like shape with a substantially constant thickness, and the thickness of said first lead and the thickness of the second lead are substantially the same.

41. The resin molding according to claim 40, wherein
a back side of the first inner lead, and
a back side of the second inner lead, and
at least a part of a back side of the first resin molding lie on substantially the same plane.

42. The resin molding according to claim 40, wherein the thermosetting resin is at least one kind selected from the group consisting of epoxy resin, modified epoxy resin, silicone resin, modified silicone resin, acrylate resin and urethane resin.

43. The resin molding according to claim 40, wherein the resin molding is formed by transfer molding process.

44. The resin molding according to claim 40, wherein said thermosetting resin of the resin molding integrally molds said first lead and said second lead.

45. The resin molding according to claim 40, wherein said resin molding disposed between the first inner lead and the second inner lead separates the first inner lead from the second inner lead below the recess.

46. The resin molding according to claim 40, wherein the front face of the first inner lead, the front face of the second inner lead and a front face of said resin molding disposed between the first inner lead and the second inner lead are on the same plane at the single bottom surface of said recess.

47. The resin molding according to claim 40, wherein the single bottom surface of said recess is flat.

48. The resin molding according to claim 40, wherein an inclination angle between the side surface and the single bottom surface of said recess is 95 to 150 degree.

49. The resin molding according to claim 40, wherein a surface of said first lead and a surface of said second lead are roughened so as to increase a contact area with the first resin molding.

50. The resin molding according to claim 40,
wherein the second lead has a single back side that is opposite to the bottom surface of the recess where the light emitting device is mounted, said back side of the second lead being exposed from the first resin molding, and
wherein a resin insulation member extends between and touches portions of the respective back sides of said first lead and said second lead, to prevent short-circuiting between the respective back sides of said first lead and said second lead.

51. A surface mounted light emitting apparatus comprising:
a light emitting device,
a first resin molding which integrally molds a first lead whereon the light emitting device is mounted and a second lead which is electrically connected to the light emitting device, and
a second resin which covers the light emitting device,
wherein the first resin molding has a single recess for receiving said light emitting device, said recess comprising, in a cross-sectional view, a single bottom surface and a single side surface at each side of the recess made from the first resin molding, a front face of the first lead and a front face of the second lead being entirely exposed from the first resin molding at the single bottom surface of the recess, with the light emitting device being mounted on the exposed portion of the first lead, said single side surface continuously maintaining a substantially constant inclination from a top of said recess to said single bottom surface; and
the first resin molding and the second resin are formed from thermosetting resins, and the first resin molding includes at least one kind selected from the group consisting of silicon oxide, diffusing agent, pigment, fluorescent material, reflective material and light blocking material, and
wherein said first resin molding is disposed between the first lead and the second lead,
wherein each of the first lead and the second lead has a single back side that is opposite to the bottom surface of the recess where the light emitting device is mounted,
wherein said single back side is exposed from the first resin molding, and wherein both of said first lead and said second lead have a plate-like shape with a substantially constant thickness, and the thickness of said first lead and the thickness of the second lead are substantially the same.

52. A surface mounted light emitting apparatus comprising:
a light emitting device,
a first resin molding which integrally molds a first lead whereon the light emitting device is mounted and a second lead which is electrically connected to the light emitting device, and
a second resin which covers the light emitting device,
wherein the first lead has a first inner lead and a first outer lead with the first inner lead having the light emitting device mounted thereon and being electrically connected to a first electrode of the light emitting device, and the first outer lead being exposed from the first resin molding;
the second lead has a second inner lead and a second outer lead with the second inner lead being electrically connected to a second electrode of the light emitting device and the second outer lead being exposed from the first resin molding;
the first resin molding has a single recess for receiving said light emitting device, said recess comprising, in a cross-sectional view, a single bottom surface and a side surface made from the first resin molding, a front face of the first inner lead and a front face of the second inner lead being entirely exposed from the first resin molding at the single bottom surface of the recess, with the light emitting device being mounted on the exposed portion of the first inner lead, said single side surface continuously maintaining a substantially constant inclination from a top of said recess to said single bottom surface;
the first resin molding and the second resin are formed from thermosetting resins, and the first resin molding includes at least one kind selected from the group consisting of silicon oxide, diffusing agent, pigment, fluorescent material, reflective material and light blocking material, and
wherein said first resin molding is disposed between the first inner lead and the second inner lead, and
wherein each of the first lead and the second lead has a single back side that is opposite to the bottom surface of the recess where the light emitting device is mounted, and said single back side is exposed from the first resin molding, and
wherein both of said first lead and said second lead have a plate-like shape with a substantially constant thickness, and the thickness of said first lead and the thickness of the second lead are substantially the same.

53. A resin molding which integrally molds a first lead and a second lead, wherein
the first lead has a first inner lead and a first outer lead with the first inner lead being placed in the resin molding and the first outer lead being exposed from the resin molding;
the second lead has a second inner lead and a second outer lead with the second inner lead being placed in the resin molding and the second outer lead being exposed from the resin molding,
the resin molding has a single recess formed therein for receiving said light emitting device, the recess comprising, in a cross-sectional view, a single bottom surface and a single side face at each side of the recess made from the resin molding, and a front face of the first inner lead and a front face of the second inner lead being exposed from the resin molding at the bottom surface of the recess, said single side surface continuously maintaining a substantially constant inclination from a top of said recess to said single bottom surface, and
the first inner lead has a single back side that is opposite to the bottom surface of the recess,
the second inner lead has a single back side that is opposite to the bottom surface of the recess, and
said single back side of the first inner lead and said single back side of the second inner lead are exposed from the resin molding; and
the resin molding is formed from a thermosetting resin, and the resin molding includes at least one kind selected from the group consisting of silicon oxide, diffusing agent, pigment, fluorescent material, reflective material and light blocking material,
wherein said resin molding is disposed between the first lead and the second lead, and
wherein both of said first lead and said second lead have a plate-like shape with a substantially constant thickness, and the thickness of said first lead and the thickness of the second lead are substantially the same.

54. A resin molding which integrally molds a first lead and a second lead, wherein
the first lead has a first inner lead and a first outer lead with the first inner lead being placed in the resin molding and the first outer lead being exposed from the resin molding,
the second lead has a second inner lead and a second outer lead with the second inner lead being placed in the resin molding and the second outer lead being exposed from the resin molding to the outside;
the resin molding has a single recess for receiving a light emitting device, said recess comprising, in a cross-sectional view, a single bottom surface and a single side surface at each side of the recess made from the resin molding, a front face of the first inner lead and a front face of the second inner lead are exposed from the resin molding at the bottom surface of the recess of the resin molding, and each of the first lead and the second lead has a single back side that is opposite to the bottom surface of the recess, wherein said single back side is exposed from the resin molding, and said single side surface continuously maintains a substantially constant inclination from a top of said recess to said single bottom surface;
the resin molding is formed from a thermosetting resin, and the resin molding includes at least one kind selected from the group consisting of silicon oxide, diffusing agent, pigment, fluorescent material, reflective material and light blocking material,
wherein said resin molding is disposed between the first inner lead and the second inner lead, and
wherein both of said first lead and said second lead have a plate-like shape with a substantially constant thickness, and the thickness of said first lead and the thickness of the second lead are substantially the same.

\* \* \* \* \*